United States Patent [19]
Suzuki et al.

[11] Patent Number: 6,084,823
[45] Date of Patent: Jul. 4, 2000

[54] SYNCHRONOUS SEMICONDUCTOR MEMORY DEVICE AND BUS CONTROL METHOD

[75] Inventors: Takaaki Suzuki; Shinya Fujioka; Yasuharu Sato, all of Kawasaki, Japan

[73] Assignee: Fujitsu Limited, Kawasaki, Japan

[21] Appl. No.: 09/323,852

[22] Filed: Jun. 2, 1999

[30] Foreign Application Priority Data

Jun. 3, 1998 [JP] Japan .................................. 10-154622

[51] Int. Cl.[7] .................................................. G11C 8/00
[52] U.S. Cl. .............. 365/233; 365/230.03; 365/230.08; 365/189.04; 365/189.05
[58] Field of Search .............................. 365/233, 230.03, 365/189.04, 230.08, 189.05

[56] References Cited

U.S. PATENT DOCUMENTS

| | | | |
|---|---|---|---|
| 4,564,926 | 1/1986 | Nikaido et al. | 365/189.02 |
| 4,928,265 | 5/1990 | Higuchi et al. | 365/189.01 |
| 5,835,443 | 11/1998 | Fujita | 365/233 |

OTHER PUBLICATIONS

"A Multimedia 32b RISC Microprocessor with 16 Mb DRAM", *IEEE ISSCC'96, Session 13 Microprocessors Paper*, FP13.4, p. 178.

"An Access–Sequence Control Scheme to Enhance Random Access Performance of Embedded DRAMs", Ayukawa et al, 1997 *Symposium on VLSI Circuits Digest of Technical Papers*, pp. 59–60.

"A Modular Architecture for a 6.4–Gbyte/s, 8–Mbit Media Chip", Watanabe et al., 1996 *Symposium on VLSI Circuits Digest of Technical Papers*, pp. 42–43.

*Primary Examiner*—Andrew Q. Tran
*Attorney, Agent, or Firm*—Arent Fox Kintner Plotkin & Kahn, PLLC

[57] ABSTRACT

There is provided a semiconductor integrated circuit memory comprising banks each having at least one memory cell array and connected to a first data bus. Each of the banks includes a control part which is supplied with information indicated by a command and thus controls a data write or read operation on a corresponding bank. The control part controls data write and read operations on the corresponding bank so that the corresponding bank is prevented from occupying the first data bus until read data is output to the first data bus by the data read operation.

29 Claims, 35 Drawing Sheets

FIG.26

| | BL=4 | BL=2 | | BL=1 | | | |
|---|---|---|---|---|---|---|---|
| caa0, 1z | — | L/- | H/- | L/L | H/L | L/H | H/H |
| sw1n | close | close | open | close | open | open | open |
| sw2n | close | close | open | close | close | close | close |
| sw3n | close | close | close | close | close | close | close |
| sw24 | open | open | close | open | open | open | open |
| sw14 | open | open | open | open | open | open | close |
| sw13 | open | open | close | open | open | close | open |
| sw12 | open | open | open | open | close | open | open |

FIG.29A

|         | BL=4     | BL=2     | BL=1     |
|---------|----------|----------|----------|
| outp0z  | clocking | clocking | clocking |
| outp1z  | clocking | clocking | —        |

FIG.29B

|         | BL=4     | BL=2     | BL=1     |
|---------|----------|----------|----------|
| psclk1z | clocking | clocking | clocking |
| psclk2z | clocking | clocking | —        |
| psclk3z | clocking | —        | —        |
| psclk0z | clocking | —        | —        |

SYNCHRONOUS SEMICONDUCTOR MEMORY DEVICE AND BUS CONTROL METHOD

BACKGROUND OF THE INVENTION

1. Field of the Invention

The present invention generally relates to semiconductor integrated circuit memories, and more particularly to a semiconductor integrated circuit memory which operates in synchronism with a clock and a method for controlling a data bus of such a semiconductor memory.

Recently, it has been required to semiconductor memory devices such as DRAM (Dynamic Random Access Memory) devices input and output data at higher frequencies in accordance with speeding up of CPUs so that the data transfer rate can be increased.

An SDRAM (Synchronous DRAM) device can operate at a high speed in synchronism with a clock signal supplied from the outside.

2. Description of the Related Art

A description will now be given of a conventional data bus control method for SDRAMs.

FIG. 1 illustrates a circuit configuration of a periphery of a memory cell of the SDRAM. The circuit shown in FIG. 1 includes a capacitor 201, NMOS (N-channel Metal Oxide Semiconductor) transistors 212, 223 and 224, and PMOS (P-channel MOS) transistors 213, 221 and 222. The PMOS transistors 221 and 222 and the NMOS transistors 223 and 223 form a sense amplifier 220.

The capacitor 201, which forms a memory cell, can store one-bit data. The data stored in the capacitor 201 is read onto a pair of data bus lines DB and /DB as follows.

The circuit shown in FIG. 1 is supplied with clock signals CK and /CK, a control signal (R (read) or W (write); R is used in this case), and address signals (including a row address and a column address). The control signal R is decoded within the SDRAM device, and results in a row address strobe signal /RAS and a column address strobe signal /CAS. The row address strobe signal /RAS selects one row system in a core circuit of the SDRAM device, that is, a word line. The column address strobe signal /CAS selects one column system in the core circuit, that is, the sense amplifier 220 shown in FIG. 1. The core circuit has a plurality of memory cells arranged in a matrix formation, and each column is provided with a respective sense amplifier such as the sense amplifier 220. Hence, the sense amplifier 220 can sense data read from the memory cells connected to the selected word line.

When the signal /RAS is input, a bit line transfer signal BLT0 is switched to a low level. At this time, a bit line transfer signal BLT1 is at a high level, and the NMOS transistors 203 and 204 are both ON. Thus, the bit lines BL and /BL become connected to the sense amplifier 220. Simultaneously, a precharge signal PR is switched to the low level, and the bit line BL is released from a precharged state.

A sub-word line select signal SW is activated and is thus set to the high level, so that the corresponding word line can be selected. Hence, the NMOS transistor 202, which functions as a cell gate, is made to conduct, and the data stored in the capacitor 201 is read to the bit line BL therefrom.

Then, sense amplifier drive signals SA1 and SA2 are activated, and the NMOS transistors 212 and 213 are thus made to conduct. In that state, the pieces of data on the bit lines BL and /BL are read by the sense amplifier 220 via the NMOS transistors 203 and 204, respectively. The sense amplifier 220 amplifies the pieces of data on the bit lines BL and /BL, so that the potential difference (amplitude) can be increased.

Then, a column line select signal CL is switched to the high level by the signal /CAS, and one of the columns is selected. The NMOS transistors 210 and 211, which function as column gates, are turned ON, and the amplified pieces of data on the bit lines BL and /BL are read to the data bus lines DB and /DB, respectively.

Thereafter, a precharge command is input, and a precharge signal PR is switched to the high level at an appropriate timing. Thus, the NMOS transistors 207, 208 and 209 are turned ON, and the bit lines BL and /BL are thus precharged to a given potential VPR. Hence, the bit lines BL and /BL are reset, and are ready to receive the next control signal (read (R) or write (W)).

At the time of writing data into the selected cell, the sequence reverse to the above-mentioned read sequence is performed. Hence, pieces of data on the data bus lines DB and /DB are stored in the capacitor 201.

A description will now be given, with reference to FIGS. 2 through 8, of a read operation and a write operation of the conventional SDRAM.

FIG. 2 is a timing chart of an operation in which data read operations are successively performed in a single-bank arrangement or the same bank in a multi-bank arrangement. It is assumed that read comments R0, R1 and R2, which are control signals, respectively select mutually different word lines.

In order to read data related to a different row address (different word line) in a bank, it is necessary to read data of memory cells connected to the selected word line onto pairs of bit lines BL and /BL and to thus precharge the bit lines BL and /BL in advance of the reading. Hence, it is required that the read commands R0, R1 and R2 be applied at given time intervals tRC (equal to, for example, 22 ns). Data read from the memory cells in response to the read command are output when the time (access time) tRAC (equal to, for example, 32 ns) necessary for data to be output after the read command such as R0 is input. The above time can be defined as a latency.

FIG. 3 is a timing chart of an operation in which data write operations are successively performed in the conventional SDRAM (the single-bank arrangement or the same bank in the multi-bank arrangement). It is assumed that write commands W0, W1 and W2 which are the control signals select different word lines.

In order to write data into different row addresses (different word lines) in the bank, the pair of bit lines BL and /BL are precharged, and pieces of data on the bit lines BL and /BL into the memory cell selected by the activated word line. Hence, in this case, the write commands W0, W1 and W2 are input at time intervals tWC (equal to, for example 32 ns) necessary for accepting the write command. Further, write data D01 and D02, write data D11 and D12, and write data D21 and D22 are input at time intervals tWR (equal to, for example, 22 ns) necessary for accepting write data.

FIG. 4 is a timing chart of an operation in which a data read operation is performed and subsequently a data write operation is performed in the conventional SDRAM (the single-bank arrangement or the same bank of the multi-bank arrangement).

Data Q01 and Q02 read by read command R0 is output when the access time tRAC of 32 ns elapses after the read command R0 is input, as in the case shown in FIG. 2. Hence, the write command W0 and write data D01 and D02 are allowed to be input after the data read operation responsive to the read command R0 is completed.

FIG. 5 is a timing chart of an operation in which a data write operation is performed and subsequently a data read operation is performed in the conventional SDRAM (the single-bank arrangement in the present case).

The read command R0 following the write command W0 is input when the time interval tWC (equal to, for example, 32 ns) necessary for accepting the next command and the time interval tWR (equal to, for example, 22 ns) elapse, as in the case shown in FIG. 3. Data Q01 and Q02 read responsive to the read command R0 are output when the access time tRAC of 32 ns necessary for associated data to be read responsive to the read command R0 elapses, as in the case shown in FIG. 2.

FIG. 6 is a timing chart of an operation in which the data read operations are serially performed with regard to different banks in the conventional SDRAM (the multi-bank arrangement in the present case). It is assumed that read commands Ra, Rb, Rc and Rd which are control signals are respectively read commands relate to banks a, b, c and d.

In this case, the banks a–d can operate independently when data are read to the bit lines BL and /BL in the respective banks a–d. Hence, the read commands Ra, Rb, Rc and Rd can successively be input. Read data is output when the access time tRAC of 32 ns elapses after the corresponding read command is input. For example, read data Qa1 is read after the access time of 32 ns starting from the time when the read command R0 is input. That is, a latency occurs which results from the circuit operation of the memory cell periphery, the operation of the sense amplifier and so on. If the same read commands, for example, R0 are successively input (the first and fourth cycles in FIG. 6), it is required to separate the same read commands from each other by at least the time interval tRC (equal to, for example, 22 ns).

FIG. 7 is a timing chart of an operation in which the data write operations are serially performed with regard to different banks in the conventional SDRAM device (the multi-bank arrangement in the present case). It is assumed that write commands Wa, Wb, Wc and Wd which are control signals are respectively write commands related to banks a, b, c and d.

In this case, the banks a–d can operate independently when data are written therein. Hence, the read commands Ra, Rb, Rc and Rd can successively be input. Write data are serially input together with the write commands Wa, Wb, Wc and Wd. If the same write commands, for example, Wa, are successively input (the first and fifth cycles in FIG. 7), it is required to separate the same write commands from each other by at least the time interval tWC (equal to, for example, 32 ns).

FIG. 8 is a timing chart of an operation in which the data write operation and the data read operation are serially performed in the conventional SDRAM (the multi-bank arrangement in the present case).

The data write and read operations correspond to the combination of the operations shown in FIGS. 6 and 7, and the operation of the command is completed and then the operation of the next command is performed.

However, the conventional memory device performing the operations shown in FIGS. 2 through 5 has the following disadvantages.

In the case shown in FIG. 2 in which the data read operations are successively performed, the read command R1 subsequent to the read command R0 cannot be input until the time interval tRC equal to, for example, 22 ns elapses after the read command R0 is input. Further, the data Q01 and Q02 read by the read command R0 is output when the access time tRAC of 32 ns elapses after the read command R0 is input. That is, the latency occurs and the data bus is occupied by the data read operation during the blank or latency period.

In the case shown in FIG. 3 in which the data write operations are successively performed, the write command W1 subsequent to the write command W0 cannot be input until the time interval tWC equal to, for example, 32 ns elapses after the write command W0 is input. Further, write data D11 and D12 associated with the write command W1 cannot be input until the time interval tWR equal to, for example, 22 ns elapses after write data D01 and D02 are input. That is, the latency occurs and the data bus is occupied by the data write operations during the latency period.

In the case shown in FIG. 4 in which the data write operation is performed subsequent to the data read operation, the write command W1 cannot be input until read data Q01 and Q02 are output when the access time tRAC of 32 ns elapses after the read command R0 is input. That is, the data bus is occupied by the read operation during the latency period equal to the access time.

In the case shown in FIG. 5 in which the data write operation is performed and the data read operation is subsequently performed, the read command R0 cannot be input until the time interval tWC equal to, for example, 32 ns elapses after the write command W0 is input and until the time interval tWR equal to, for example, 22 ns elapses after the write data D01 and D02 are input. Hence, the data bus is occupied by the write operation during the latency period.

As described above, in the cases shown in FIGS. 2 through 5, the long latency period occurs during which the data bus is occupied. Hence, the next operation cannot be performed until the long latency period elapses. This prevents speeding up of the data read and write operations.

The same disadvantages as those described above occur in the operations shown in FIGS. 6 through 8. More particularly, in the case shown in FIG. 6 in which the data read operations are serially performed with regard to different banks, read data responsive to the read commands Ra, Rb, Rc and Rd are respectively output when the access time tRAC of 32 ns elapses after these commands are respectively input. Hence, the data bus is occupied by the series of data read operations until the last read data Da1 and Da2 are output after the read command Ra is input.

In the case shown in FIG. 7 in which the data write operations are performed with regard to different banks, the data bus is occupied by the series of data write operations until the time interval tWC equal to, for example, 32 ns elapses from the last write command Wa and until the time interval tWR equal to, for example, 22 ns elapses from write data D01 and D02 are input.

In the case shown in FIG. 8 in which the write and read operations are performed with regard to different banks, the data bus is occupied by the write and read operations until the last read data Qc1 and Qc2 are output after the first write command Wa is input.

The operations shown in FIGS. 6 through 8 are faster than those shown in FIGS. 2 through 5 but have a disadvantage in that the data bus is occupied by each operation. Hence, it is still required to speed up the data read and write operations.

SUMMARY OF THE INVENTION

It is a general object of the present invention to provide a semiconductor integrated circuit memory and a data bus control method therefor in which the above disadvantages are eliminated.

A more specific object of the present invention is to more efficiently use the data bus and thus speed up the data write and read operations.

The above objects of the present invention are achieved by a semiconductor integrated circuit memory comprising banks each having at least one memory cell array and connected to a first data bus. Each of the banks includes a control part which is supplied with information indicated by a command and thus controls a data write or read operation on a corresponding bank. The control part controls data write and read operations on the corresponding bank so that the corresponding bank is prevented from occupying the first data bus until read data is output to the first data bus by the data read operation.

The above objects of the present invention are also achieved by a data bus control method for a semiconductor integrated circuit memory comprising banks each having at least one memory cell array and connected to a first data bus, the method including the steps of: (a) receiving a command; and (b) controlling, for each of the banks, data write/read operations based on the command so that the first data bus is prevented from being occupied by a data read operation on one of the banks in progress until read data is output to the first data bus.

The above objects of the present invention are also achieved by a semiconductor integrated circuit memory including banks each having at least one memory cell array and connected to a first data bus, each of the banks comprising a control part which is supplied with a write command and a read command and thus controls a data write or read operation on a corresponding bank. When the control part in another one of the banks is performing the data read operation in response to the read command, the control part of the corresponding bank latches the write command and write data associated therewith and starts to perform the data write operation on the corresponding bank.

The above objects of the present invention are also achieved by a data bus control method for a semiconductor integrated circuit memory comprising banks each having at least one memory cell array and connected to a first data bus, the method including the steps of: (a) receiving a command; and (b) controlling, for each of the banks, data write/read operations based on the command so that, when the data read operation is being performed in one of the banks in response to a read command, a write command directed to another one of the banks and write data associated therewith are latched and the data write operation on said another one of the banks is started.

BRIEF DESCRIPTION OF THE DRAWINGS

Other objects, features and advantages of the present invention will become more apparent from the following detailed description when read in conjunction with the accompanying drawings, in which:

FIG. 26 shows the possible status of switches of a data bus switch unit shown in FIG. 25;

FIGS. 29A and 29B show relationships between four control clock signals and two output control clock signals;

DESCRIPTION OF THE PREFERRED EMBODIMENTS

Figure 1:
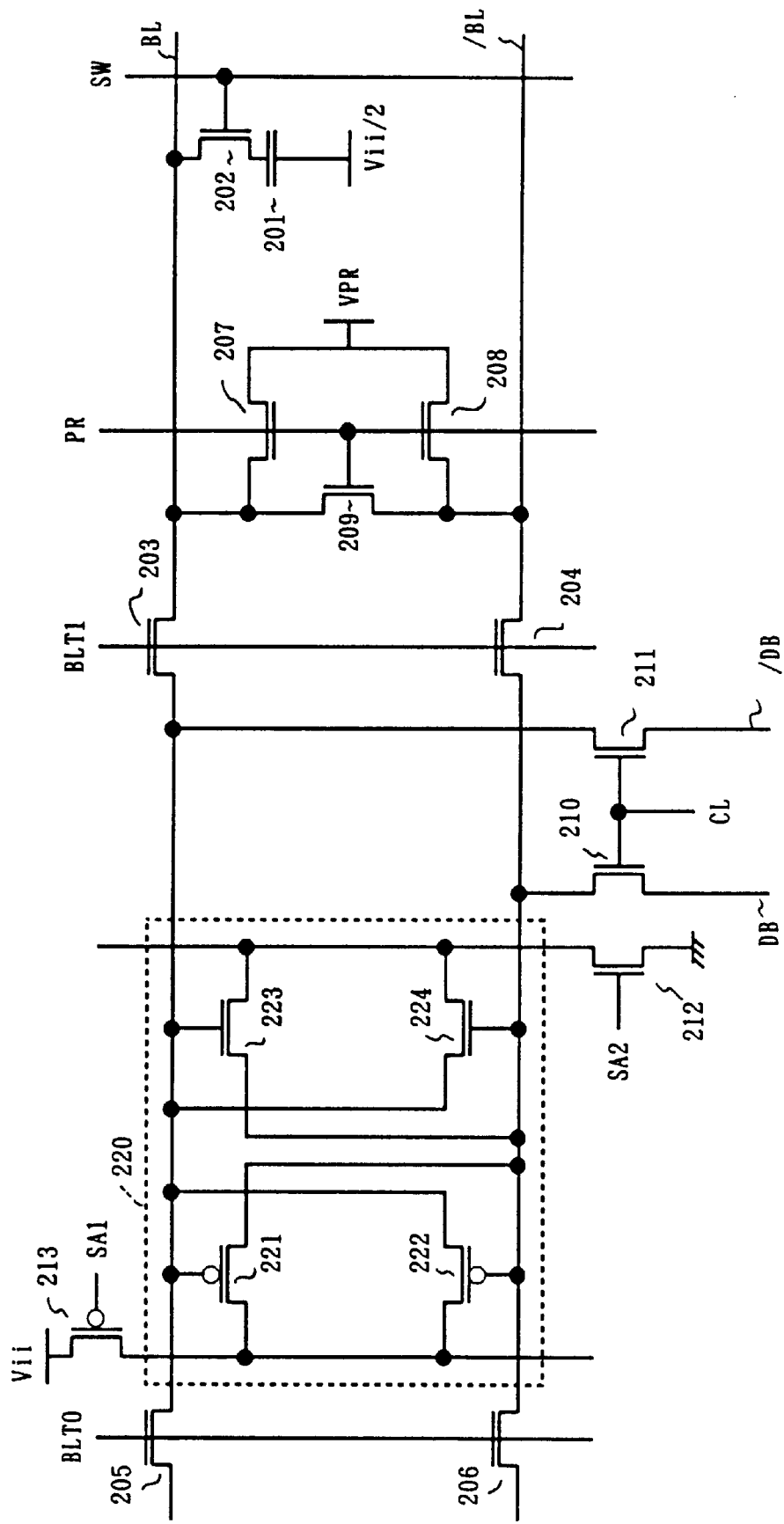
FIG. 1 is a circuit diagram of a memory cell and its peripheral circuits.
Figure 2:
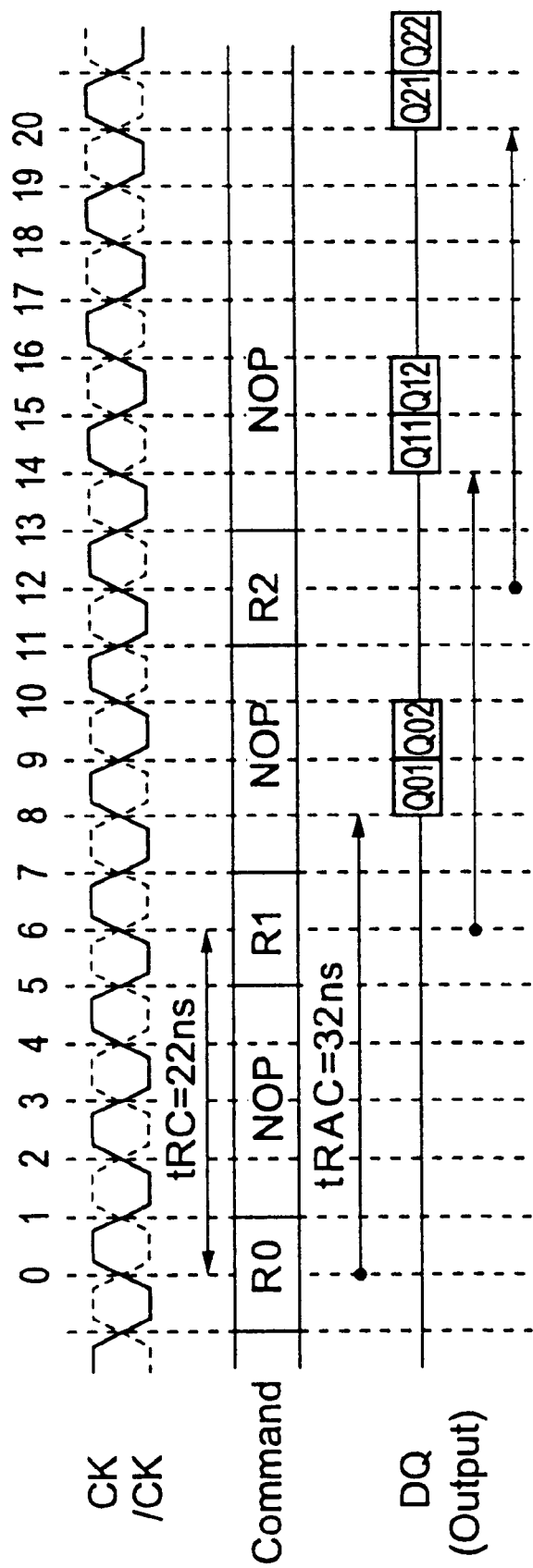
FIG. 2 is a timing chart of a conventional data read operation.
Figure 3:
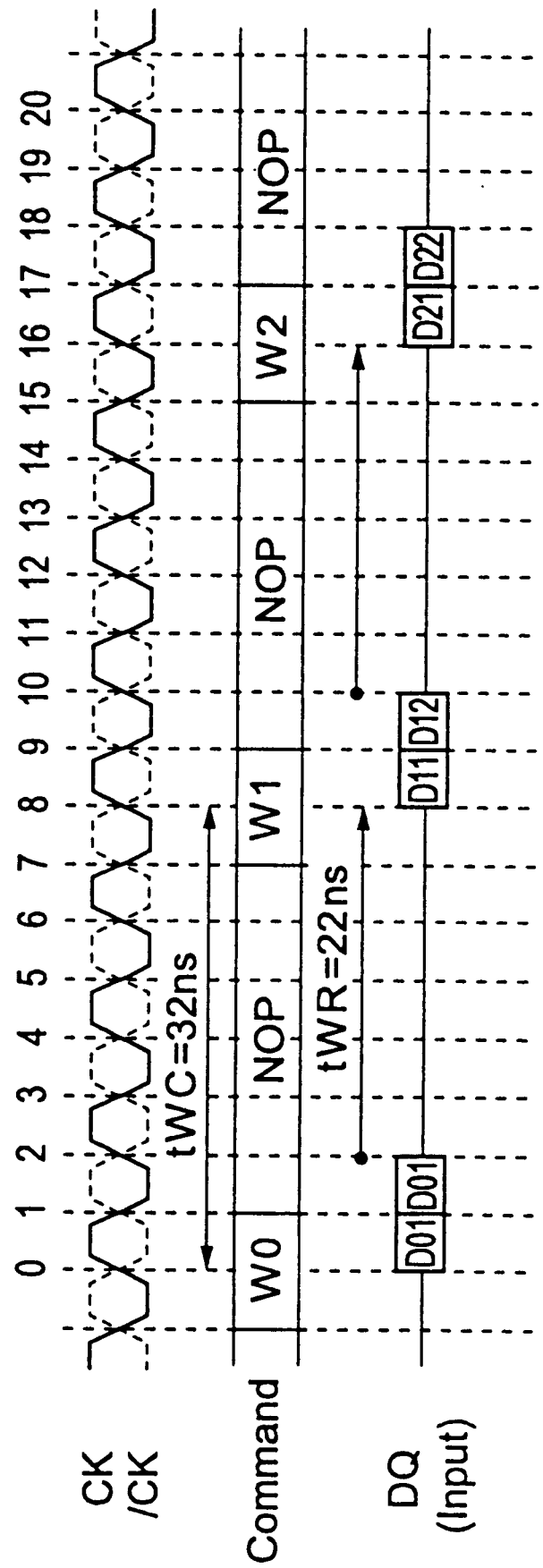
FIG. 3 is a timing chart of a conventional data write operation.
Figure 4:
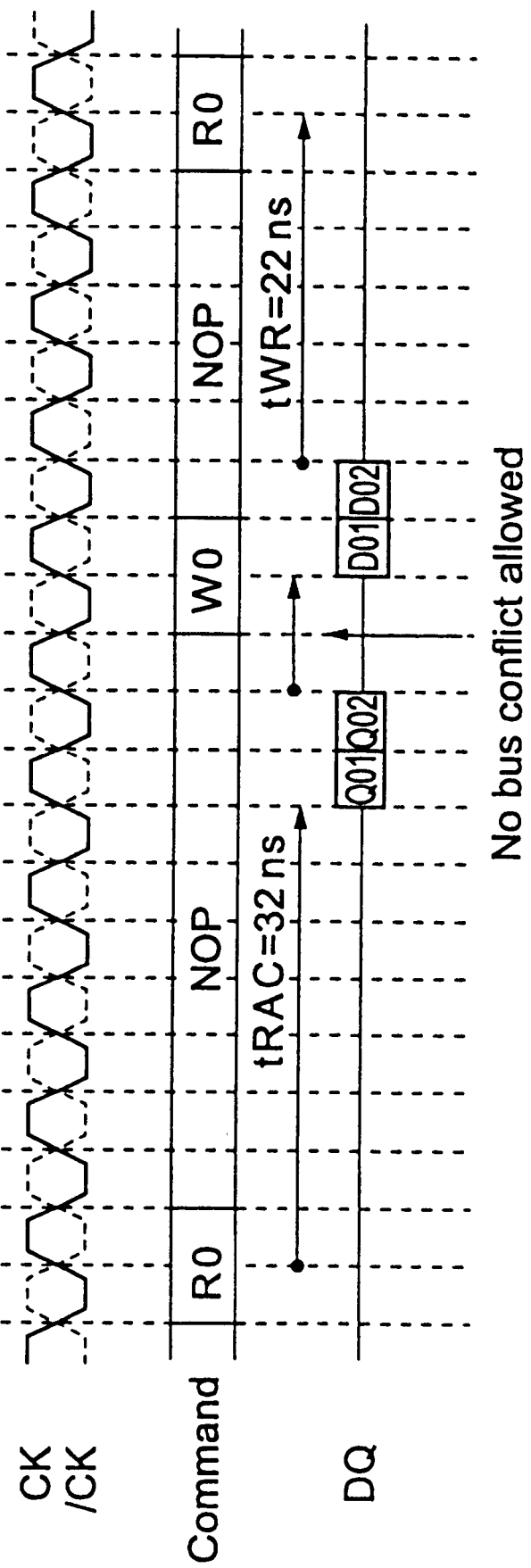
FIG. 4 is a timing chart of conventional data read and write operations.
Figure 5:
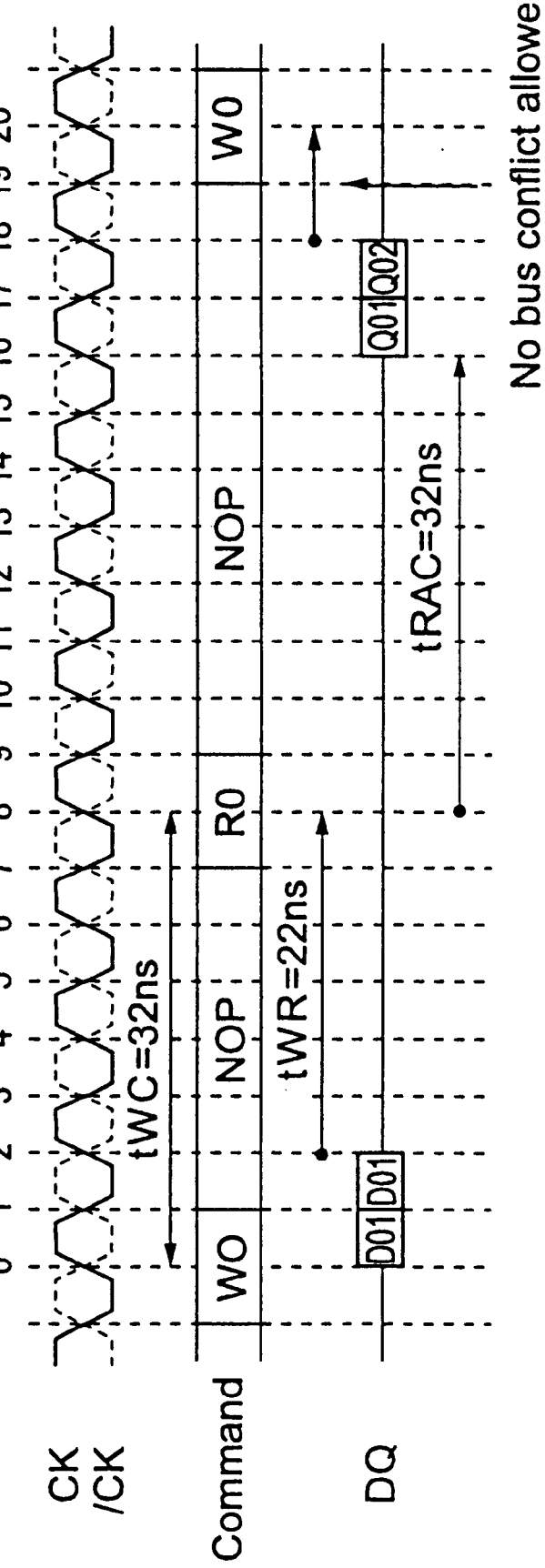
FIG. 5 is a timing chart of conventional data read and write operations.
Figure 6:
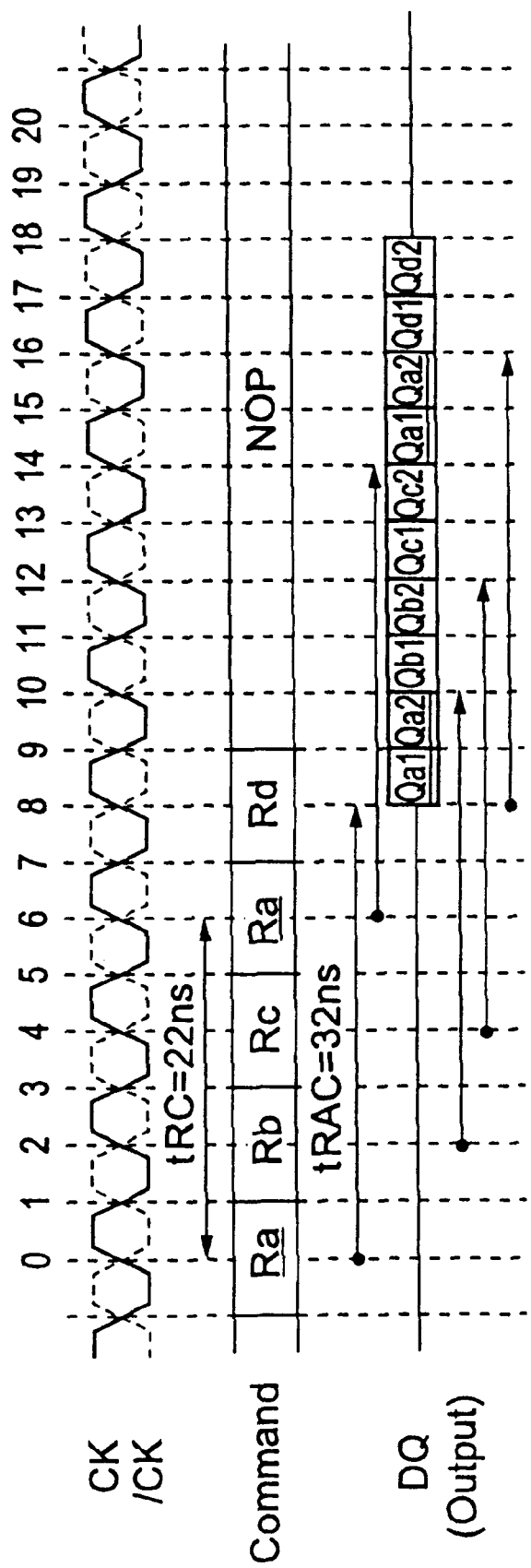
FIG. 6 is a timing chart of a conventional data read operation.
Figure 7:
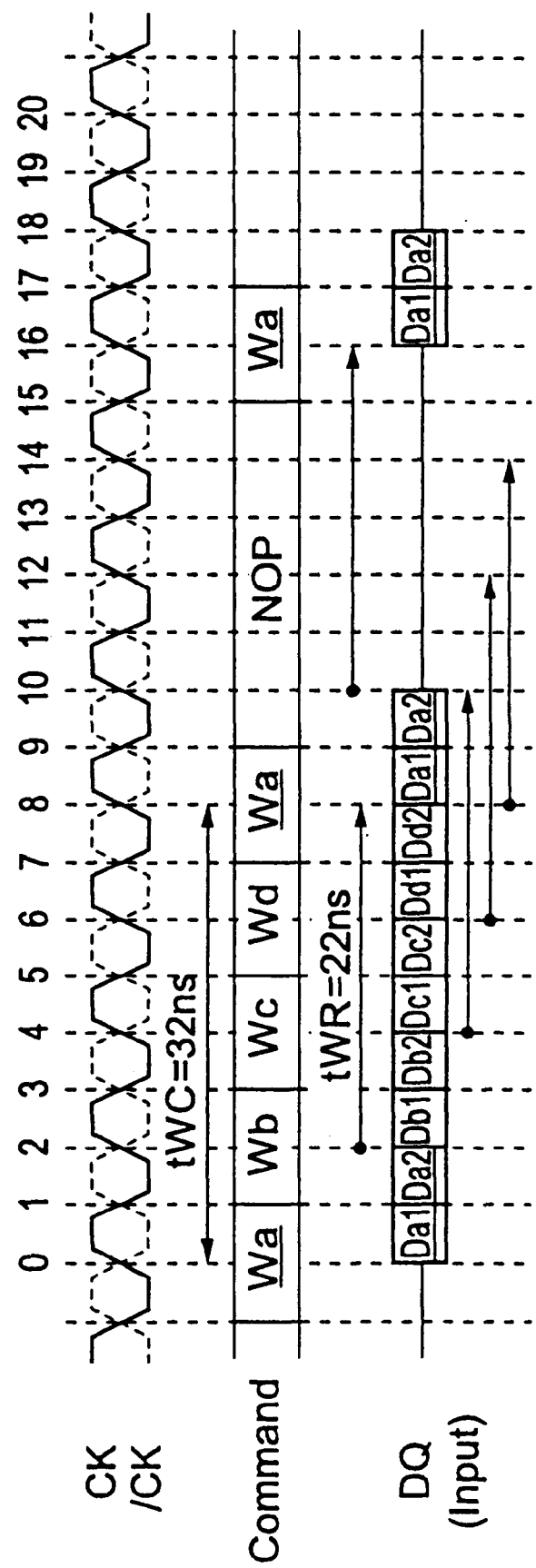
FIG. 7 is a timing chart of a conventional data write operation.
Figure 8:
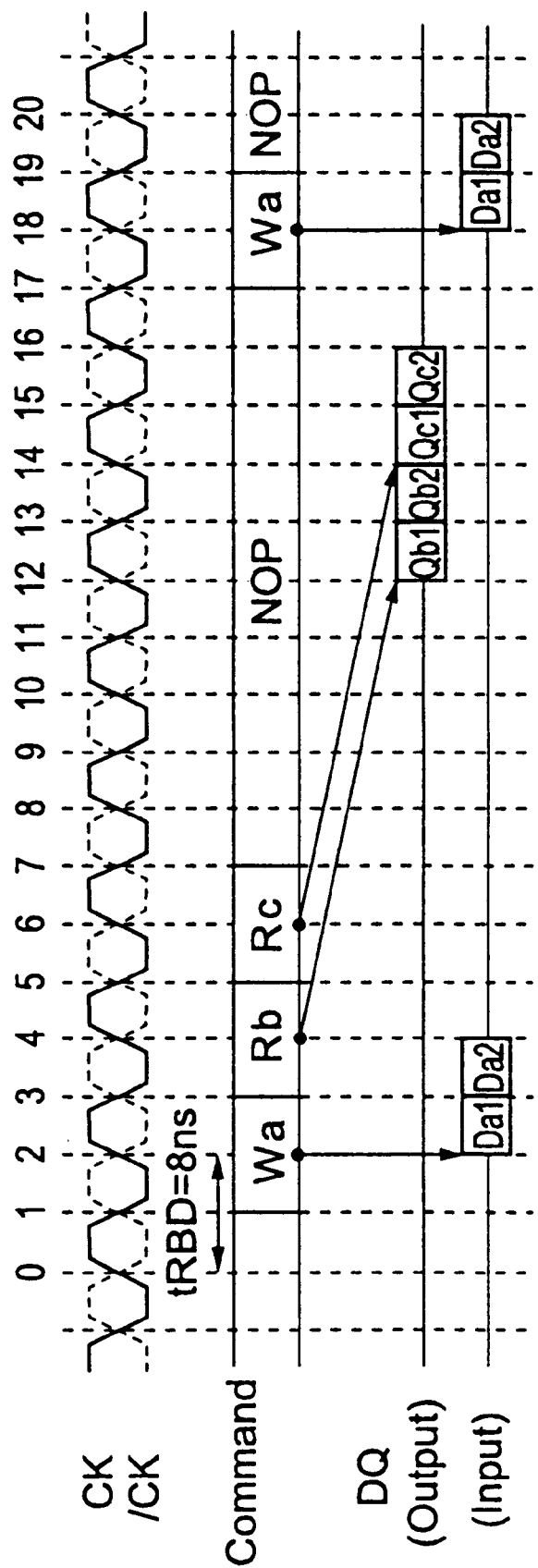
FIG. 8 is a timing chart of conventional data read and write operations.
Figure 9:
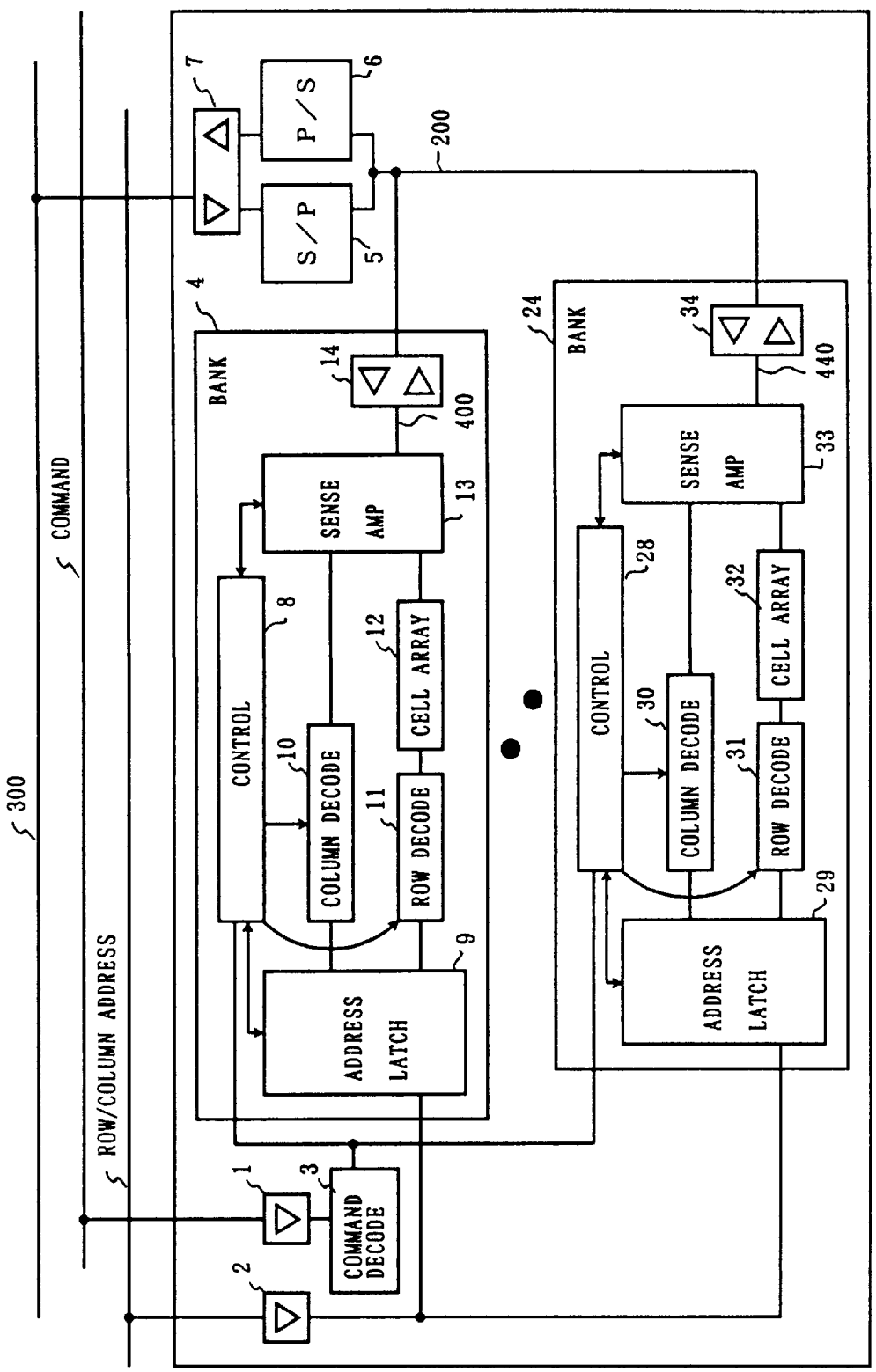
FIG. 9 is a block diagram of a semiconductor integrated circuit memory according to a first embodiment of the present invention.

FIG. 9 is a block diagram of a semiconductor integrated circuit memory according to a first embodiment of the present invention.

The memory shown in FIG. 9 includes a command input part 1, an address input part 2, a command decoder 3, banks 4 and 24, a serial-to-parallel (S/P) converter 5, a parallel-to-serial (P/S) converter 6, and a data input/output part 7. The banks 4 and 24 are connected to the data input/output part 7 by a common peripheral or internal data bus 200. The input/output part 7 is connected to an external or global data bus 300. The sense amplifier 13 and the input/output data latch part 14 are connected together by a core data bus 400. Similarly, the sense amplifier 33 and the input/output data latch part 34 are connected together by a core data bus 440. According to the first embodiment of the present invention, a data write operation is performed by utilizing the latency period resulting from a data read operation being performed.

The memory cells used in the first embodiment of the present invention have a DRAM type cell structure. The memory cells are arranged in matrix formation and are included in memory cell array parts 12 and 32 of the banks 4 and 24. The memory cell array parts 12 and 32 respectively include sense amplifiers.

The command input part 1 receives commands supplied from the outside of the memory, such as a read command and a write command. The address input part 2 receives a memory address supplied from the outside of the memory. The command decoder 3 decodes the command externally supplied, and a decoded command is applied to control parts 8 and 28 of the banks 4 and 24. The S/P converter 5 converts write data that is input via the data input/output part 7 in serial formation into parallel data, which supplies the banks 4 and 24. The P/S converter 6 converts parallel data read from the banks 4 and 24 into serial data, which is then output to the outside of the memory via the data input/output part 7.

The bank 4 includes, in addition to the control part 8 and the memory cell array 12, an address latch part 9, a column decoder 10, a row decoder 11, a sense amplifier part 13 including a plurality of sense amplifiers, an input/output data latch part 14. The address latch part 9 decodes the address from the address input part 2, and latches the corresponding address. The row decoder 11 generates a word line select signal, which selects memory cells connected to a row specified by the decoded address. The sense amplifier part 13 receives and holds, in the built-in sense amplifiers, data read from the memory cells in the memory cell array part 12 selected by the word line select signal. The column decoder 10 generates a column line select signal which selects a specific sense amplifier from among the sense amplifiers of the sense amplifier part 13. The input/output data latch part 14 latches read data selected by the column line select signal and write data externally supplied. The control part 8 stores the decoded command state and controls the data read operation and the data write operation of the bank 4, which operations can be performed independently of those of the bank 24.

The bank 24 includes, in addition to the aforementioned control part 28 and the memory cell array part 32, an address latch part 29, a column decoder 30, a row decoder 31, a sense amplifier part 32, and an input/output data latch part 34, which structural elements are the same as the corresponding elements of the bank 4.

Although the memory shown in FIG. 9 includes two banks 4 and 24, it can include more than two banks.

A description will now be given of operations of the memory according to the first embodiment of the present invention.

Figure 17:
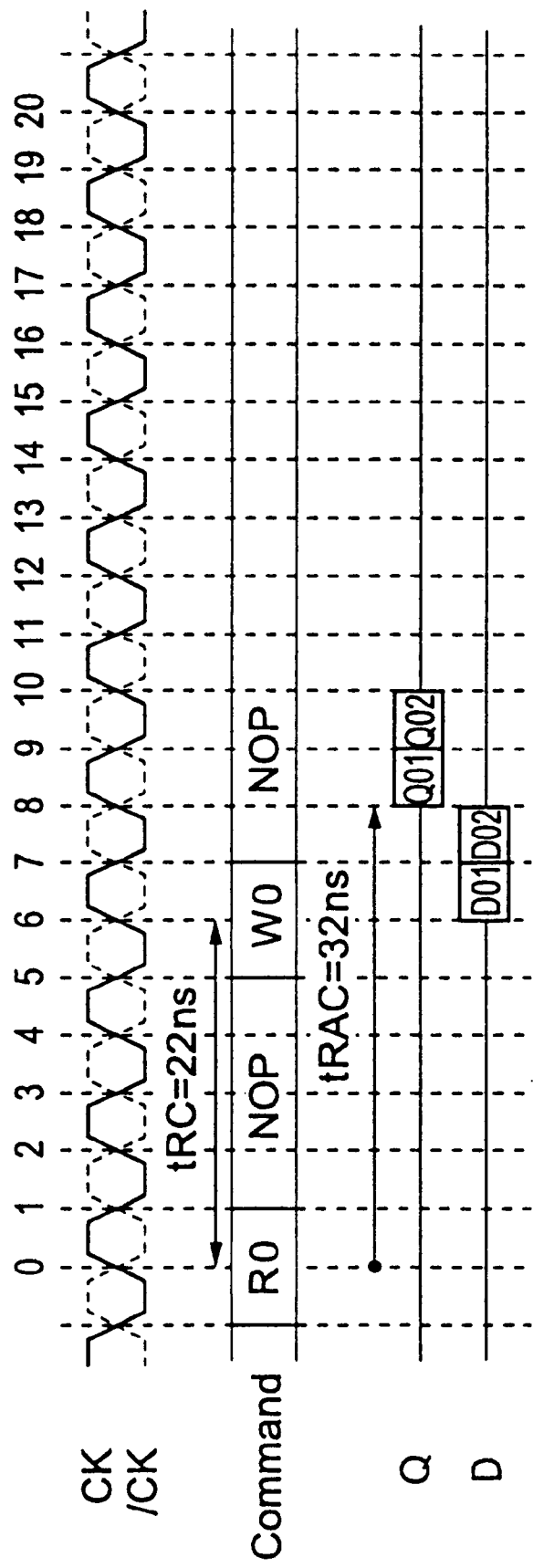
FIG. 17 is a timing chart of data read and write operations in the memories of the embodiments of the present invention.

FIG. 17 is a timing chart of an operation in which a data write operation is performed, during the latency period resulting from a data read operation on a bank (for example, bank 4) being executed, with respect to the same bank as described above. It is assumed that a read command R0 and a write command W0 are related to the same bank (bank 4, for example).

When data is read from the memory cell array 12 of the bank 4, data are newly read out to the bit lines BL and /BL from the memory cells connected to the selected word line. Data Q01 and Q02 read from the memory cells are output to the external data bus 300 (FIG. 9) when the access time tRAC equal to, for example, 32 ns elapses after the read command R0 is latched at a change point or time 0 of the clock CK (and clock /CK). The access time equal to 32 ns is a latency resulting from the command decoding operation by the command decoder 3, the circuit operations of the memory cell periphery (more particularly, the address latch circuit 9, the control part 8, the column decoder 10, the row decoder 11, and the memory cell array 12), and the operation of the sense amplifier part 13.

It is required to precharge the bit lines BL and /BL before the next command is input. Hence, the next command is input when the time interval tRC of, for example, 22 ns elapses after the read command R0 is input at the clock change point 0. That is, the write command W0 subsequent to the read command R0 is latched at a clock change point 6 and data D01 and D02 are serially latched. It is to be noted that the conventional SDRAM device does not have control parts respectively provided to the banks but has a single control part common to the banks. Hence, the conventional SDRAM device uses the data bus in time division formation for each operation such as the read or write operation. For example, the external data bus 300 is occupied by the data read operation as long as the data read operation is in progress, that is, data Q01 and Q02 are completely output.

In contrast, the banks 4 and 24 have the respective control parts 8 and 28. Even before the read data Q01 and Q02 are output to the outside of the memory (that is, the read operation is in progress), the data write operation can be performed under the control of the control part 8 which controls the input/output data latch part 14, the S/P converter 5, the P/S converter 6 and the data input/output part 7. More particularly, the following operations are performed during the latency period including clock change points or times 6–8. First, an input buffer built in the data input/output part 7 is enabled. Second, the output of the P/S converter 5 is enabled (ON). Third, the output of the S/P converter 6 is disabled (OFF). Further, write data D01 and D02 are latched in the input/output data latch circuit 14. Hence, data D01 and D02 can be written into the memory cell array part 12 by utilizing the latency period.

Hence, the data read operation and the data write operation can be performed simultaneously. In other words, the data write operation is performed within the time necessary for the data read operation. Hence, it is possible to efficiently utilize the external data bus 300 and reduce the total read and write operation time.

Figure 18:
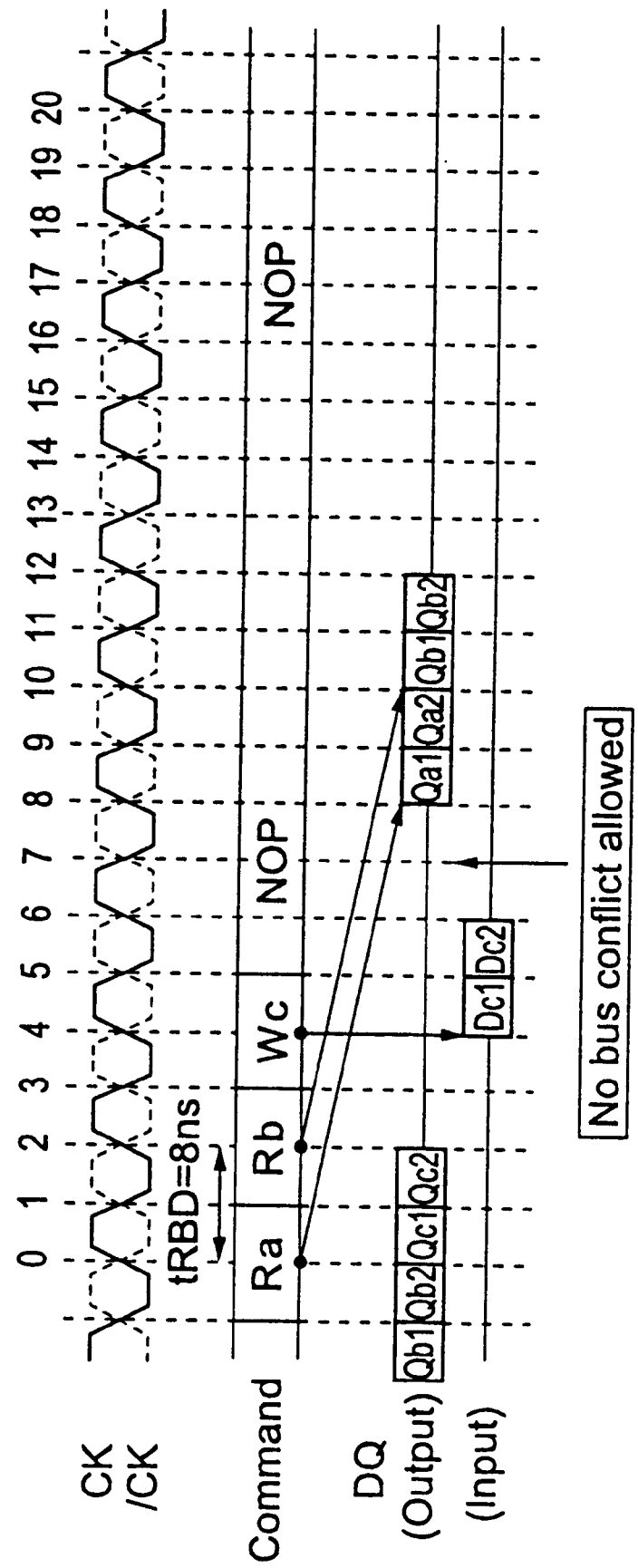
FIG. 18 is a timing chart of data read and write operations in the memories of the embodiments of the present invention.

FIG. 18 is a timing chart of an operation in which data read operations are successively performed with respect to banks a and b and a data write operation is performed with respect to a bank (named bank c) other than the banks a and b by utilizing the latency periods resulting from the data read operations related to the banks a and b.

A read command Ra related to the bank a and a read command Rb related to the bank b are successively input. The read commands Ra and Rb are latched at clock change points 0 and 2, respectively. In order to read data from the memory cell array parts of the banks a and b, it is necessary to newly read data from the selected memory cells to the bit lines BL and /BL, as in the case shown in FIG. 17. Read data Qa1, Qa2, Qb1 and Qb2 are respectively output to the external data bus 300 when the access time tRAC of, for example, 32 ns elapses after the read commands Ra and Rb are latched. That is, there are the latency periods resulting from the read commands Ra and Rb.

However, in the operation shown in FIG. 18, the commands Ra, Rb and Wc are directed to the mutually different banks a, b and c. The bit lines BL and /BL in each bank have been precharged when the next command is input. Hence, the next command can be input immediately after the read command is latched at the clock change point 0 of the clock CK (/CK).

More particularly, the read command R0 is latched at the clock change point 0, and the read command Rb is latched at the clock change point 2. Finally, the write command Wc is latched at the clock change point 4. Thereafter, data Dc1 and Dc2 are latched.

In the conventional memory, the external data bus is occupied by the read operations until data are completely read to the external data bus by the read operations even when the next write command is performed with respect to a bank different from the banks which are subjected to the read operations. That is, the external data bus is occupied by the read operations and the write operation cannot be performed until data Qa1, Qa2, Qb1 and Qb2 are output to the external data bus.

In contrast, in the operation shown in FIG. 18, the control part of the bank c can control the input/output data latch part of the bank c, the S/P converter 5, the P/S converter 6, and the data input/output part 7, and performs the data write operation even before data are read to the external data bus 300 by the preceding read commands. More particularly, the following operations are performed during the period including clock change points 4–6. The input buffer of the data input/output part 7 is enabled. The output of the S/P converter 5 is turned ON. The output of the P/S converter 6 is turned OFF. Write data Dc1 and Dc2 are latched in the input/output data latch part of the back c.

Hence, the data read operations and the data write operation can be performed simultaneously. In other words, the data write operation is performed within the time necessary for the data read operations. Hence, it is possible to efficiently utilize the external data bus 300 and reduce the total read and write operation time.

Figure 19:
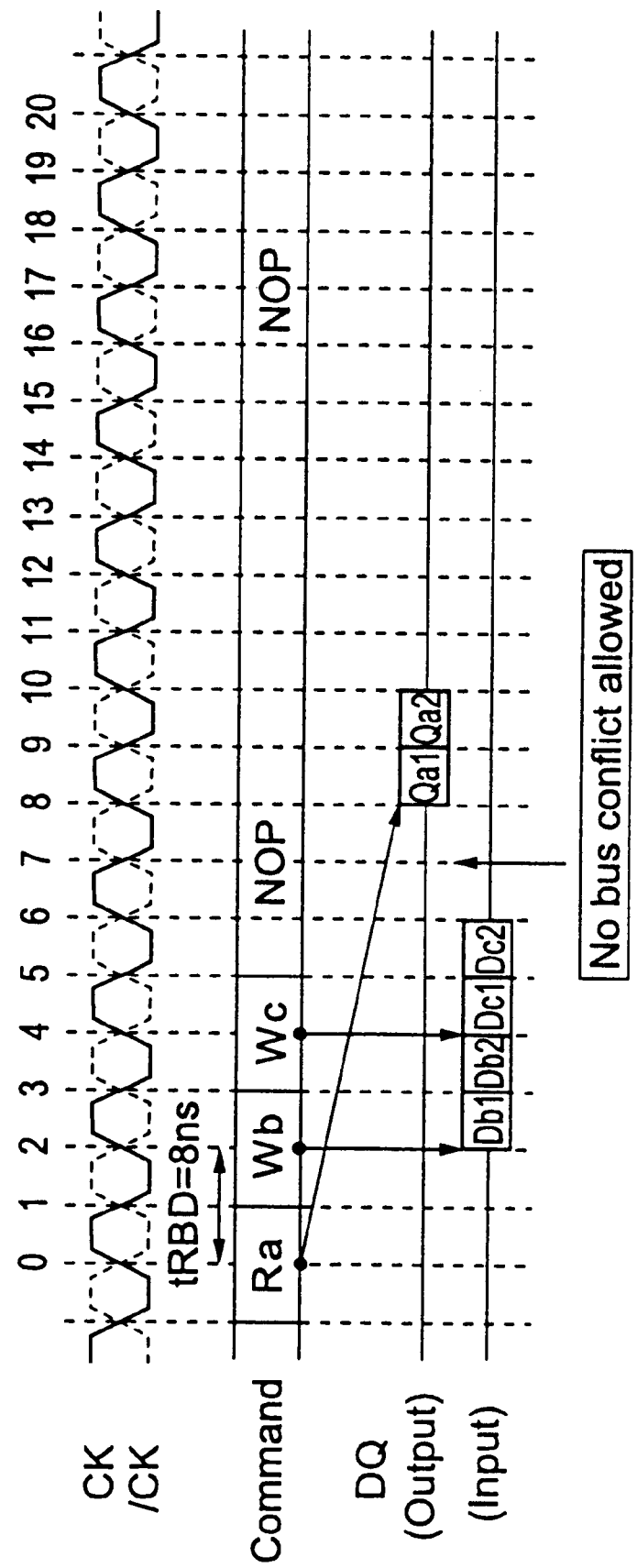
FIG. 19 is a timing chart of data read and write operations in the memories of the embodiments of the present invention.

FIG. 19 is a timing chart of an operation in which a data read operation on the bank a is performed and data write operations are successively performed with respect to banks (for example, banks b and c) other than the bank a by utilizing the latency period resulting from the above data read operation.

The read command Ra for the bank a is input, and is latched at the clock change point 0. In order to read data stored in the memory cell array part of the bank a, it is necessary to newly read data stored in the selected memory cells to the bit lines BL and /BL, as in the case shown in FIG. 17. Read data Qa1 and Qa2 are output to the external data bus 300 after the given time. That is, there is the latency resulting from the read operation due to the same factors as those of the case shown in FIG. 17.

In the case shown in FIG. 19, since the data read operation and the data write operation are performed with respect to the different banks, the next command can be input immediately after the read command Ra is latched at the clock change point 0, as in the case shown in FIG. 18.

Hence, the read command Ra is latched at the clock change point 0, and the write command Wb and associated data Db1 and Db2 are latched at the clock change point 2. Finally, the write command Wc and associated write data Dc1 and Dc2 are latched at the clock change point 4.

In the conventional SDRAM, the external data bus is exclusively used by the read operation until the read data Qa1 and Qa2 are output to the external data bus. Hence, the write operation cannot be performed until the read operation is completed even when the write operation is directed to the bank different from the bank which is subjected to the read operation.

In contrast, according to the present invention, the control parts of the banks b and c control the respective input/output data latch parts, the S/P converter 5, the P/S converter 6 and the data input/output part 7 even while the preceding data write operation is in progress. More particularly, the following operations are performed during the latency period including the clock change points 2–6. The input buffer of the data input/output part 7 is enabled. The output of the S/P converter 5 is turned ON, while the output of the P/S converter 6 is turned OFF. The write data Db1 and Db2 are latched in the input/output data latch part of the bank b, and the write data Dc1 and Dc2 are latched in the input/output data latch part of the bank c.

Hence, the data read operations and the data write operation can be performed simultaneously. In other words, the data write operation is performed within the time necessary for the data read operations. Hence, it is possible to efficiently utilize the external data bus and reduce the total read and write operation time.

Figure 20:
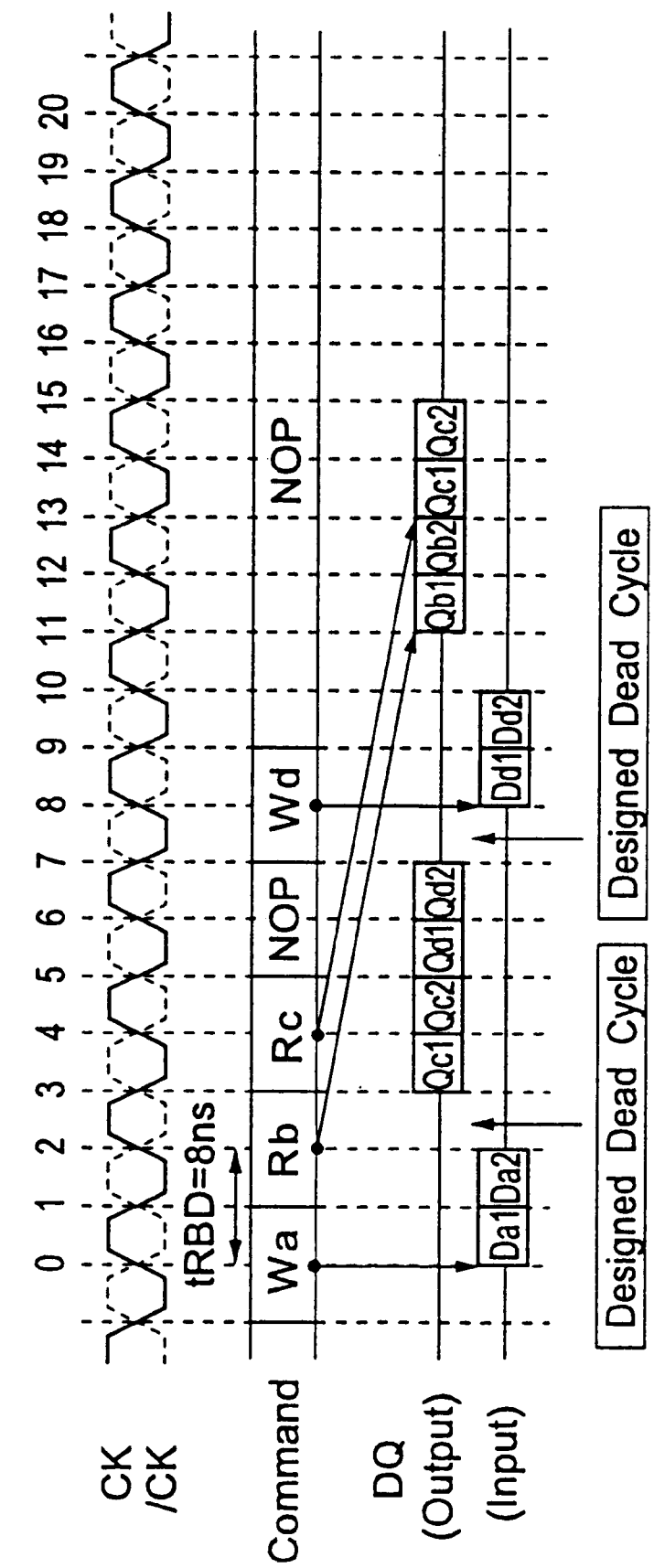
FIG. 20 is a timing chart of data read and write operations in the memories of the embodiments of the present invention.

FIG. 20 is a timing chart of an operation in which a data write operation on the bank a and subsequent data read operations on the banks b and c are performed, and a data write operation on a bank other than the banks a–c is performed by utilizing the latency periods resulting from the data read operations.

The write command Wa with respect to the bank a is input and is latched at the clock change point 0. Then, the read commands Rb and Rc with respect to the banks b and c are latched at the clock change points 2 and 4, respectively. As in the case shown in FIG. 17, in order to read data stored in the memory cell array parts of the bank b and c to the external data bus 300, it is necessary to newly read data from the selected memory cells to the bit lines BL and /BL. Read data Qb1, Qb2, Qc1 and Qc2 are output to the external data bus 300 after the given time intervals elapse.

In the case shown in FIG. 20, the data read operation and the data write operation are performed with the different banks. Hence, the next command can be input immediately after the write command Wa is latched at the clock change point 0. More particularly, the write command Wa and associated data Da1 and Da2 are latched at the clock change point 0, and the read command Rb is latched at the clock change point 2. Subsequently, the read command Rc is latched at the clock change point 4. In the case shown in FIG. 20, read data Qc1, Qc2, Qd1 and Qd2 resulting from the previous read commands (not shown in FIG. 20) are output between the clock change point 3 and the clock change point 7. Hence, the write command Wd and associated write data Dd1 and Dd2 are latched at the clock change point 8 when the reading of the data Qc1, Qc2, Qd1 and Qd2 has been completed.

In the conventional SDRAM, the external data bus is exclusively used and the write command Wd cannot be input until the read data Qb1, Qb2, Qc1 and Qc2 are completely output to the external data bus even when the above write command is directed to a bank different from the banks involved in the read operations.

In contrast, according to the present invention, the control part of the bank d controls the input/output data latch part of the bank d, the S/P converter 5, the P/S converter 6, and the data input/output part 7 and makes it possible to perform the write operation even before the read data Qb1, Qb2, Qc1 and Qc2 are output to the external data bus 300. More particularly, the following operations are performed during the latency periods including the clock change points 8–10. The input buffer of the data input/output part 7 is enabled. The output of the S/P converter 5 is turned ON, and the output of the P/S converter 6 is turned OFF. Hence, the write data Dd1 and Dd2 are latched in the input/output data latch part of the bank d.

Hence, the data read operations and the data write operation can be performed simultaneously. In other words, the data write operation is performed within the time necessary for the data read operations. Hence, it is possible to efficiently utilize the external data bus and reduce the total read and write operation time.

Figure 21:
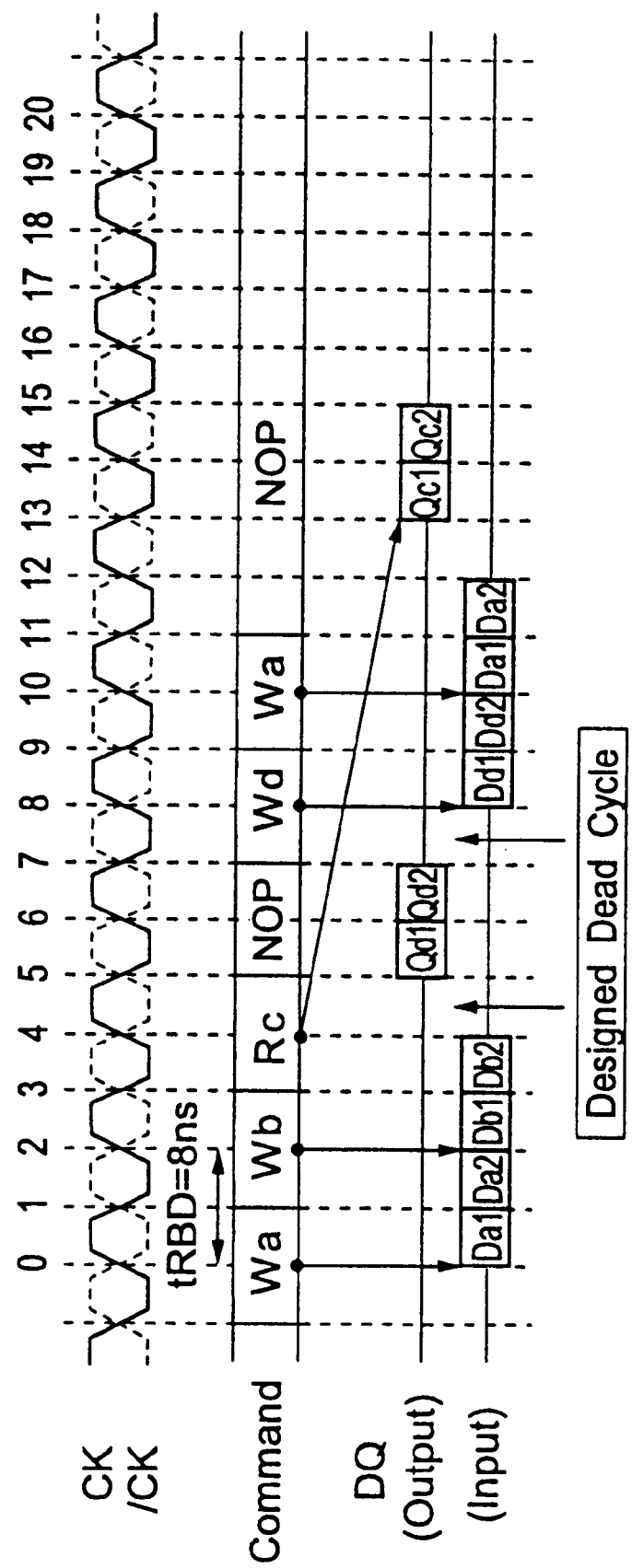
FIG. 21 is a timing chart of data read and write operations in the memories of the embodiments of the present invention.

FIG. 21 is a timing chart of an operation in which data write operations with respect to the banks a and b and a data read operation with respect to the bank c are serially performed, and a data write operation is subsequently performed with respect to the bank d different from the banks a–c.

The write commands Wa and Wb with respect to the banks a and b are serially input and are latched at the clock change points 0 and 2, respectively. The read command Rc with respect to the bank c is input and is latched at the clock change point 4. As in the case shown in FIG. 17, in order to read data stored in the memory cell array part of the bank c, it is necessary to newly read data from the selected memory cells to the bit lines BL and /BL. Read data Qc1 and Qc2 are output to the external data bus 300 after the given time which results in the latency.

In the case shown in FIG. 21, the data read operation and the data write operation are respectively carried out with respect to the different banks. Hence, as in the case shown in FIG. 18, the next command can be input immediately after the write command Wa is latched at the clock change point 0.

More particularly, the write command Wa and associated write data Da1 and Da2 are latched at the clock change point 0. Subsequently, the write command Wd and associated write data Db1 and Db2 are latched at the clock change point 2. Then, the read command Rc is latched at the clock change point 4. During the period between the times 5 and 7, the external data bus 300 is occupied by read data Qd1 and Qd2 that are read in response to a preceding read command (not shown). Thus, at the clock change point 8, the write command Wd and associated data Da1 and Da2 are latched.

In the conventional SDRAM, the external data bus is occupied by the read operation until the associated read data Qc1 and Qc2 are output to the external data bus. In contrast, even before the read data Qc1 and Qc2 are output to the external data bus 300, the control parts of the banks d and a separately control the respective input/output data latch parts, the S/P converter 5, the P/S converter 6 and the data input/output part 7, and perform the respective data write operations. More particularly, the following operations are performed using the latency period including the clock change points 8–12. The input buffer of the data input/output part is enabled. The output of the S/P converter 5 is turned ON, and the output of the P/S converter 6 is turned OFF. Then, the write data Dd1 and Dd2 are written into the input/output data latch part of the bank d, and the write data Da1 and Da2 are written into the input/output data latch part of the bank a.

Hence, the data read operations and the data write operation can be performed simultaneously. In other words, the data write operation is performed within the time necessary for the data read operations. Hence, it is possible to efficiently utilize the external data bus and reduce the total read and write operation time.

Figure 22:
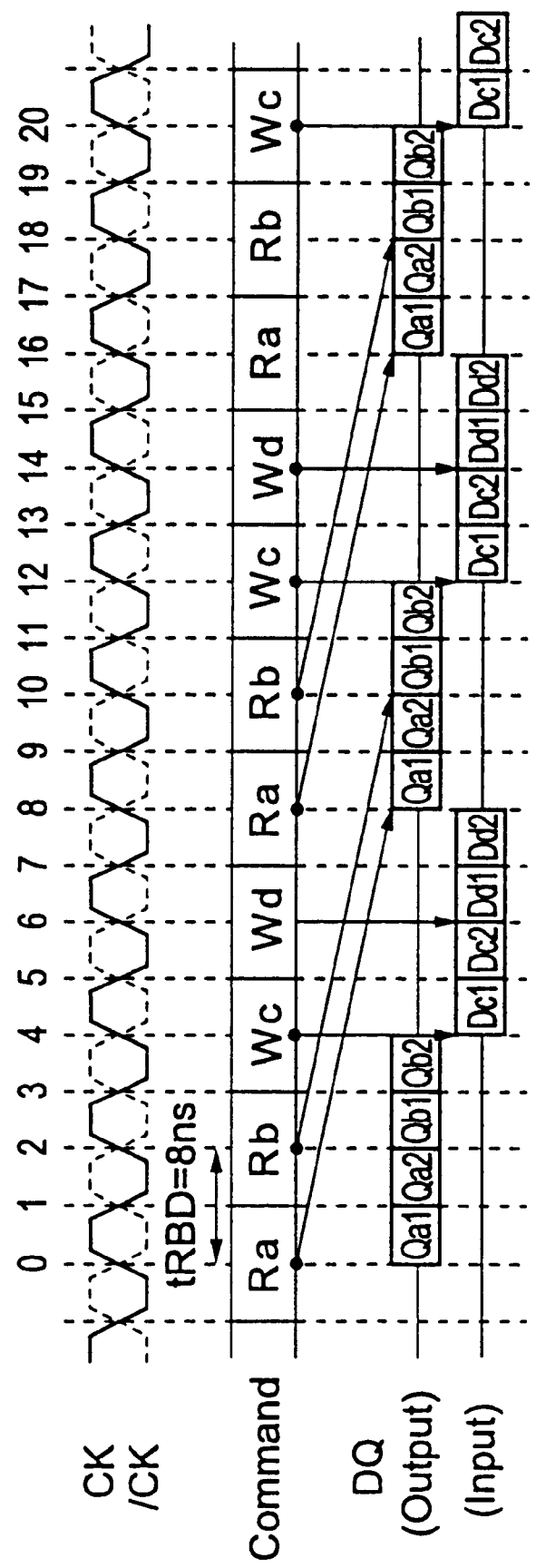
FIG. 22 is a timing chart of data read and write operations in the memories of the embodiments of the present invention.

FIG. 22 is a timing chart of an operation in which data read operations are performed with respect to the banks a and b, and data write operations are successively performed with respect to other banks c and d by utilizing the latency periods resulting from the data read operations.

The read commands Ra and Rb with respect to the banks a and b are serially input, and are then latched at the clock change points 0 and 2, respectively. As in the case shown in FIG. 17, in order to read data stored in the memory cell arrays of the banks a and b, it is necessary to newly read data from the selected memory cells to the bit lines BL and /BL. Read data Qa1 and Qa2 and Qb1 and Qb2 are output to the external data bus 300 after the given time which serves as the latency.

In the case shown in FIG. 22, the data read and write operations are performed with respect to the different banks. Hence, as in the case shown in FIG. 18, the next command can be input immediately after the read command Ra is latched at the clock change point 0. More particularly, the read command Ra is latched at the clock change point 0, and subsequently the read command Rb is latched at the clock change point 2. Then, the write command Wc and associated data Dc1 and Dc2 are latched at the clock change point 4. Further, the write command Wd and associated data Dd1 and Dd2 are latched at the clock change point 6.

In the conventional SDRAM, the external data bus is occupied by the data read operations until the read data Qa1, Qa2, Qb1 and Qb2 are output to the external data bus 300 even when the data write operation is directed to the different bank.

In contrast, the control parts of the banks c and d separately control the respective input/output data latch parts, the S/P converter 5, the P/S converter 6 and the data input/output part 7, and perform the respective data write operations even before the read data Qa1, Qa2, Qb1 and Qb2 are output to the external data bus 300. More particularly, the following operations are performed during the latency periods including the clock change points 4–8. The input buffers of the data input/output parts of the banks c and d are enabled. The output of the S/P converter 5 is turned ON, while the output of the P/S converter 6 is turned OFF. Then, the write data Dc1 and Dc2 are written into the memory cell array part of the bank c, and the write data Dd1 and Dd2 are written into the memory cell array part of the bank d.

Hence, the data read operations and the data write operation can be performed simultaneously. In other words, the data write operation is performed within the time necessary for the data read operations. Hence, it is possible to efficiently utilize the external data bus and reduce the total read and write operation time.

Figure 23:
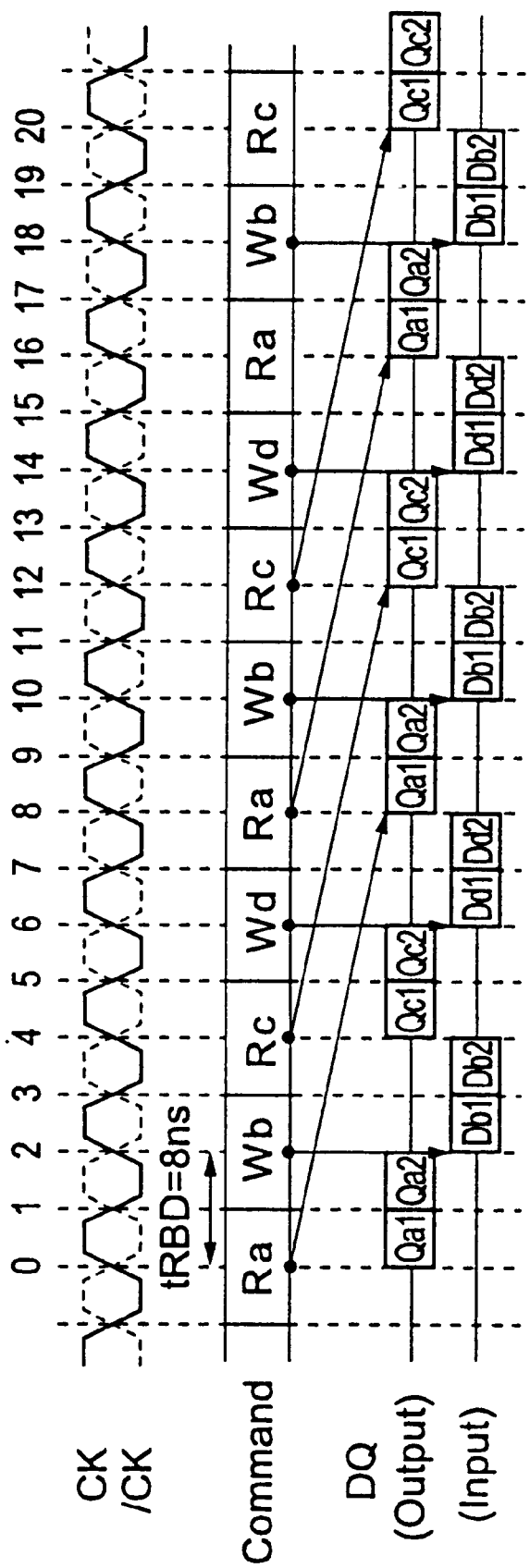
FIG. 23 is a timing chart of data read and write operations in the memories of the embodiments of the present invention.

FIG. 23 is a timing chart of an operation in which the data read operations are performed with respect to the banks a and c, and the data write operations are performed with respect to the other banks b and d by utilizing the latency periods resulting from the data read operations.

The read command Ra with respect to the bank a is input and is latched at the clock change point 0. Resultant read data Qa1 and Qa2 are output to the external data bus 300 after the given time which serves as the latency.

In the case shown in FIG. 22, the data read and write operations are performed with respect to the different banks. Hence, as in the case shown in FIG. 18, the next command can be input immediately after the read command Ra is latched at the clock change point 0. More particularly, the read command Ra is latched at the clock change point 0, and subsequently the write command Wb and associated write data Db1 and Db2 are latched at the clock change point 2. Then, the read command Rc is latched at the clock change point 4. Finally, the write data Wd and associated write data Dd1 and Dd2 are latched at the clock change point 6.

In the conventional SDRAM, the external data bus is occupied by the data read operations until the read data Qa1, Qa2, Qc1 and Qc2 are output to the external data bus even when the data write operation is directed to the different bank.

In contrast, the control parts of the banks b and d separately control the respective input/output data latch parts, the S/P converter 5, the P/S converter 6 and the data input/output part 7, and perform the respective data write operations even before the read data Qa1, Qa2, Qc1 and Qc2 are output to the external data bus 300. More particularly, the following operations are performed during the latency periods including the clock change points 4–8. The input buffers of the data input/output parts of the banks b and d are enabled. The output of the S/P converter 5 is turned ON, while the output of the P/S converter 6 is turned OFF. Then, the write data Db1 and Db2 are written into the memory cell array part of the bank b, and the write data Dd1 and Dd2 are written into the memory cell array part of the bank d.

Hence, the data read operations and the data write operation can be performed simultaneously. In other words, the data write operation is performed within the time necessary for the data read operations. Hence, it is possible to efficiently utilize the external data bus and reduce the total read and write operation time.

Figure 10:
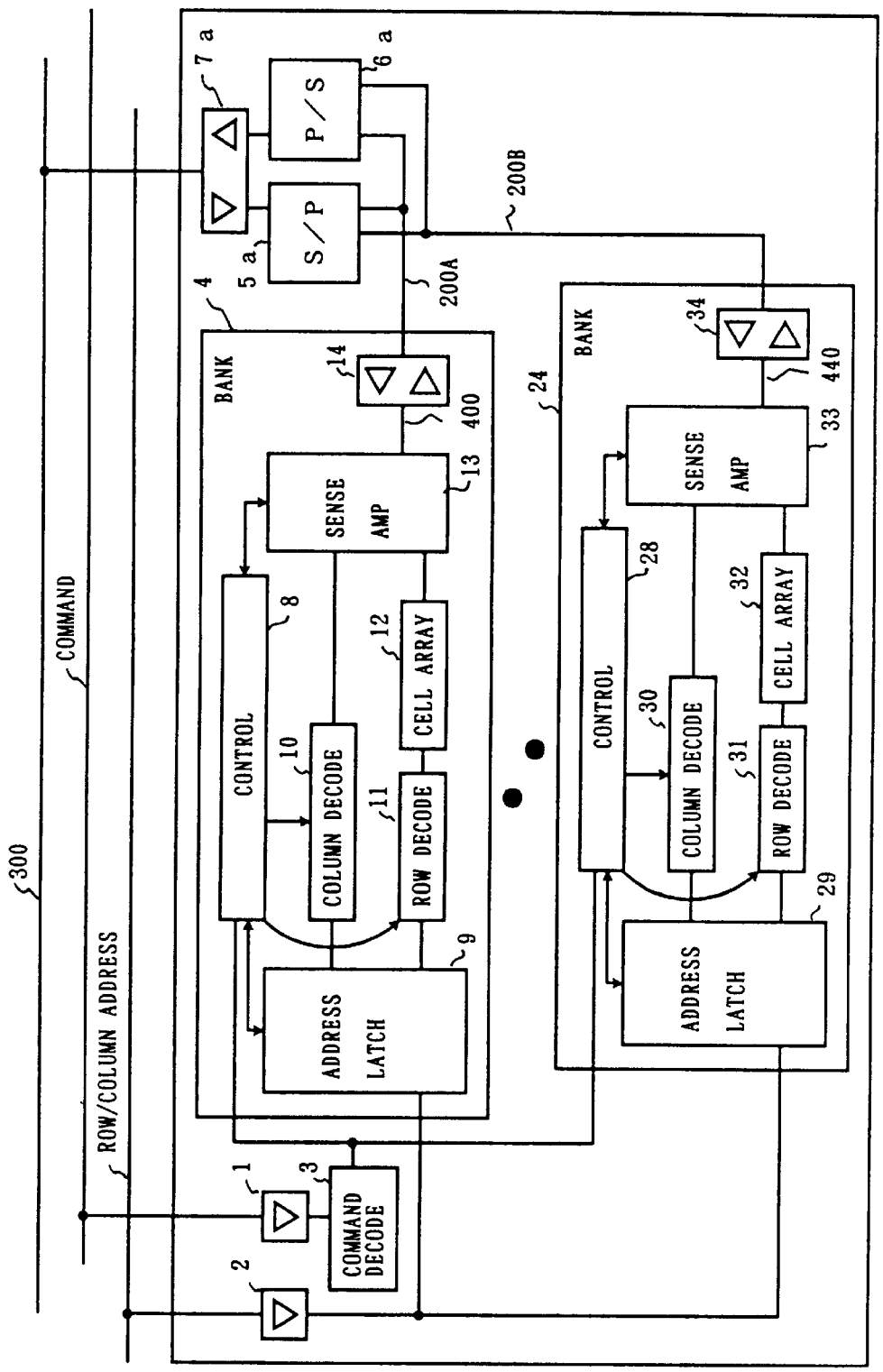
FIG. 10 is a block diagram of a semiconductor integrated circuit memory according to a second embodiment of the present invention.

A description will now be given, with reference to FIG. 10, of a semiconductor integrated circuit memory according to a second embodiment of the present invention. In FIG. 10, parts that are the same as those shown in FIG. 9 are given the same reference numbers.

The memory shown in FIG. 10 includes the command input part 1, the address input part 2, the command decoder 3, the banks 4 and 24, a S/P converter group 5a, a P/S converter group 6a, and a data input/output part group 7a. The banks 4 and 24 and the data input/output part group 7a are connected by respective peripheral data buses 200A and 200B. It is to be noted that the banks 4 and 24 shown in FIG. 9 are connected to the data input/output part 7 by the common peripheral data bus 200.

The S/P converter groups 5a includes S/P converters respectively provided to the banks 4 and 24. Similarly, the P/S converter groups 6a include P/S converters respectively provided to the banks 4 and 24. Read data from the banks 4 and 24 are applied to the respective P/S converters via the respective peripheral data buses 200A and 200B and are then output to the external data bus 300 via the data input/output part group 7a. Write data coming from the external data bus 300 are applied to the S/P converters via the data input/output part group 7a, and are applied to the banks 4 and 24 via the respective peripheral data buses 200A and 200B.

The memory shown in FIG. 10 operates in the same manners as shown in FIGS. 17 through 23 which show the operations of the memory shown in FIG. 9. According to the second embodiment of the present invention, each of the control parts of the banks can separately select the respective peripheral data bus 200A or 200B and the bus arbitration can be facilitated.

Figure 11:
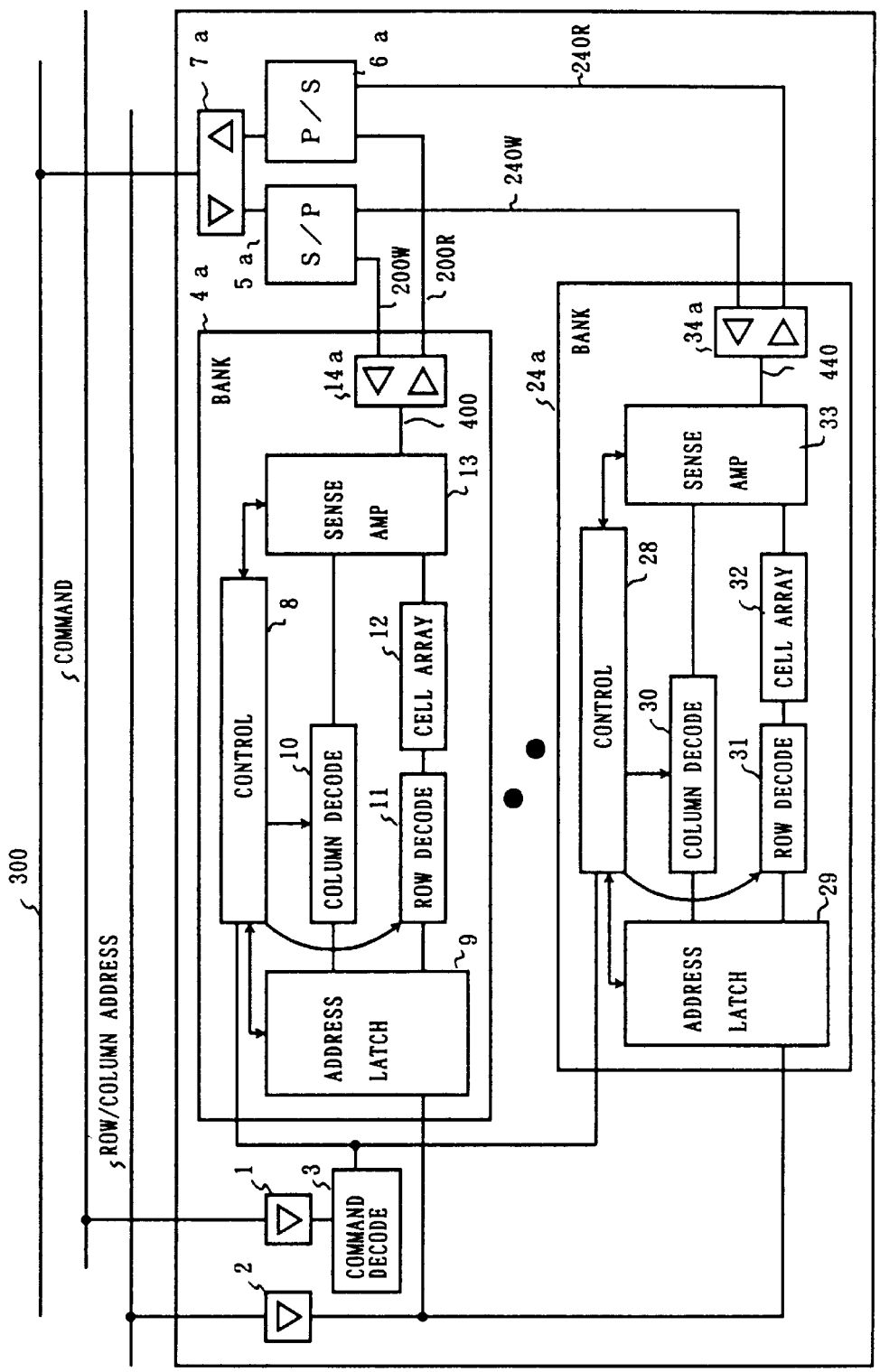
FIG. 11 is a block diagram of a semiconductor integrated circuit memory according to a third embodiment of the present invention.

A description will now be given, with reference to FIG. 11, of a semiconductor integrated memory device according to a third embodiment of the present invention. In FIG. 11, parts that are the same as those shown in the previously described figures are given the same reference numbers.

The memory shown in FIG. 11 includes the command input part 1, the address input part 2, the command decoder 3, a bank 4a, a bank 24a, the S/P converter group 5a, the P/S converter group 6a and the data input/output part group 7a. The peripheral data buses 200A and 200B, which respectively connect the banks 4a and 24a to the groups 5a and 6a, are separated into peripheral write data buses 200W and 240W for transferring only write data and peripheral read data buses 200R and 240R for transferring only read data. Thus, an input/output data latch part 14a of the bank 4a includes a write-data-specific latch and a read-data-specific latch. Similarly, an input/output data latch part 34a of the bank 34a includes a write-data specific latch and a read-data-specific latch.

The memory shown in FIG. 11 operates in the same manners as shown in FIGS. 17 through 23 which show the operations of the memory shown in FIG. 9. According to the third embodiment of the present invention, each of the control parts of the banks can separately select the respective peripheral data bus and the bus arbitration can further be facilitated.

Figure 12:
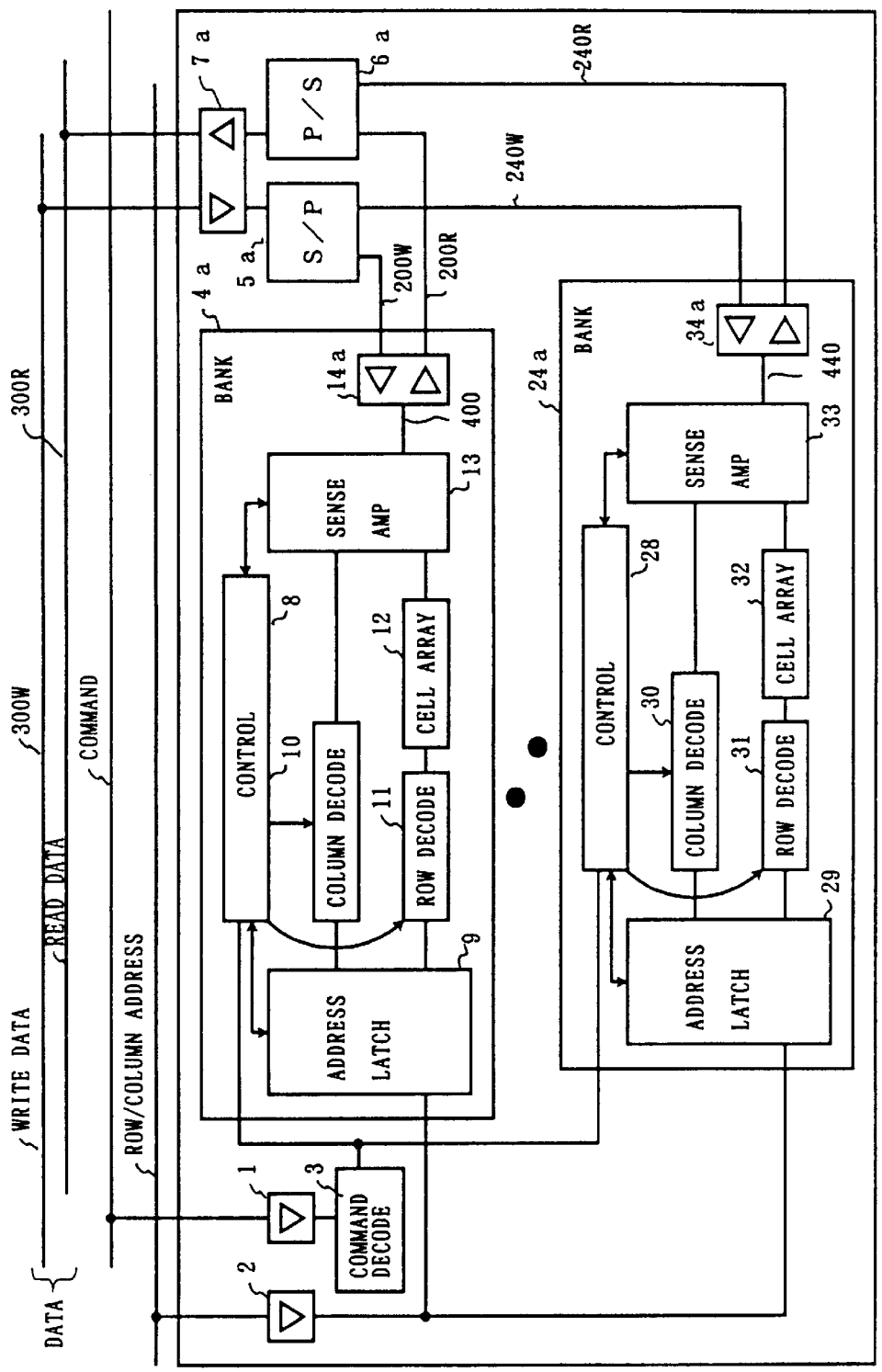
FIG. 12 is a block diagram of a variation of the configuration shown in FIG. 11.

FIG. 12 shows a variation of the third embodiment of the present invention shown in FIG. 11. In FIG. 12, parts that are the same as those shown in FIG. 11 are given the same reference numbers. In the configuration shown in FIG. 12, the external data bus 300 is separated into an external write data bus 300W and an external read data bus 300R (input/output separation).

The configuration shown in FIG. 12 allows read data and write data to coexist on the external read data bus 300R and the external write data bus 300W, respectively. Hence, the configuration shown in FIG. 12 allows the read and write commands to arbitrary be arranged or input. In other words, the configuration shown in FIG. 12 accepts an arbitrary sequence of read and write commands. In contrast, the first through third embodiments of the present invention do not allow the coexistence of the write and read data on the external data bus 300. This means that the write and read commands should be arranged in an allowable order.

Figure 31:
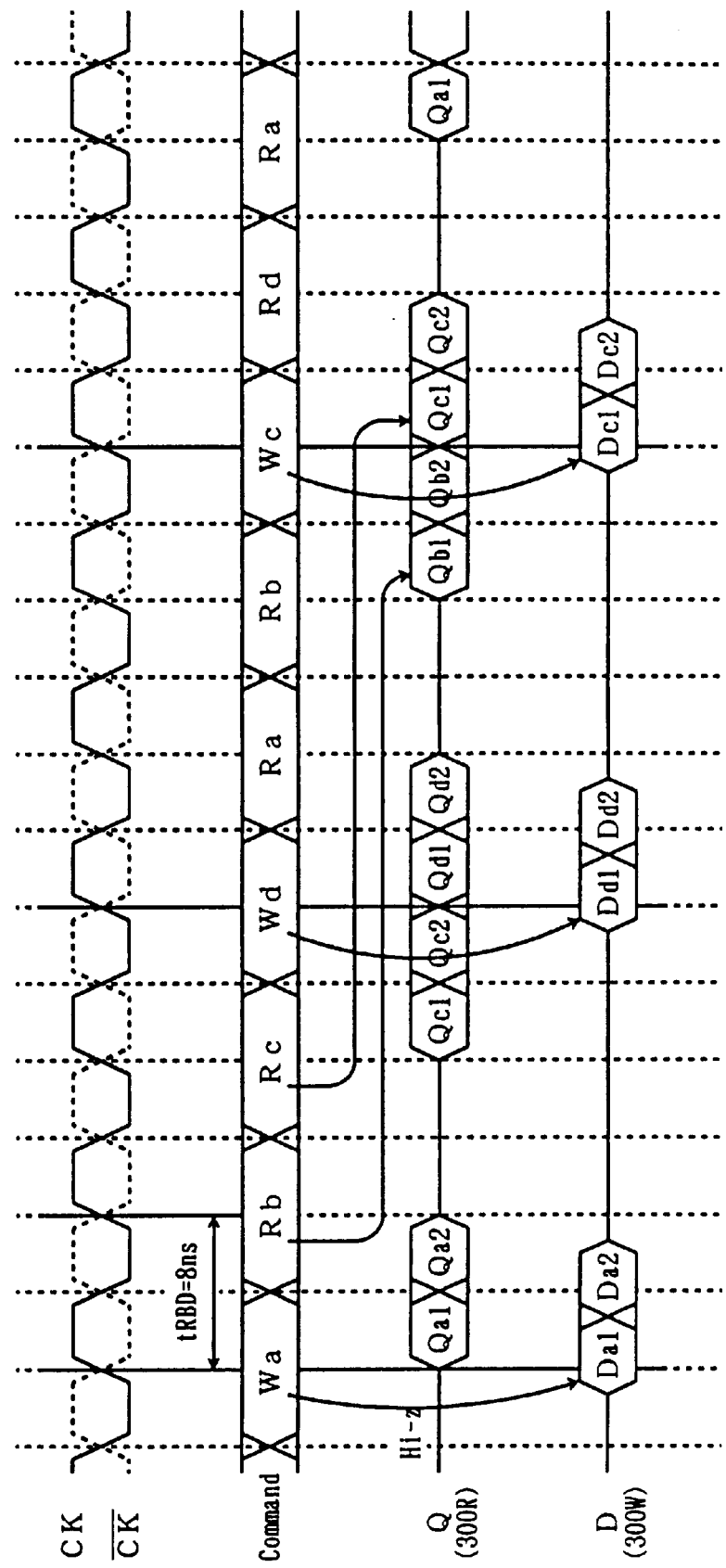
FIG. 31 is a timing chart of an operation of the variation of the third embodiment of the present invention through the seventh embodiments thereof.

FIG. 31 is a timing chart of an operation of the configuration shown in FIG. 12 in which data read and write operations are serially performed with respect to different banks. More particularly, as in the case shown in FIG. 20, a data write operation on the bank a and subsequent data read operations on the banks b and c are performed, and a data write operation on bank d other than the banks a–c is performed by utilizing the latency periods resulting from the above data read operations.

As shown in FIG. 31, the commands are successively applied without null operation periods (NOP). This is because the external data bus 300 is separated into the write data bus 300W and the read data bus 300R. Thus, the read data and write data are allowed to be carried on the write data bus 300W and the read data bus 300R. For example, read data Qa1 and Qa2 exist on the read data bus 300R and simultaneously write data Da1 and Da2 exist on the write data bus 300W. Hence, it is possible to successively apply read and write commands to the memory without taking into account the sequence of commands.

In contrast, as shown in FIG. 20, the null operation period is provided between the read command Rc and the write command Wd because the external data bus 300 is required to be used by the read and write commands in time-division formation. Thus, the read data and write data are not simultaneously present on the external data bus 300.

Figure 32:
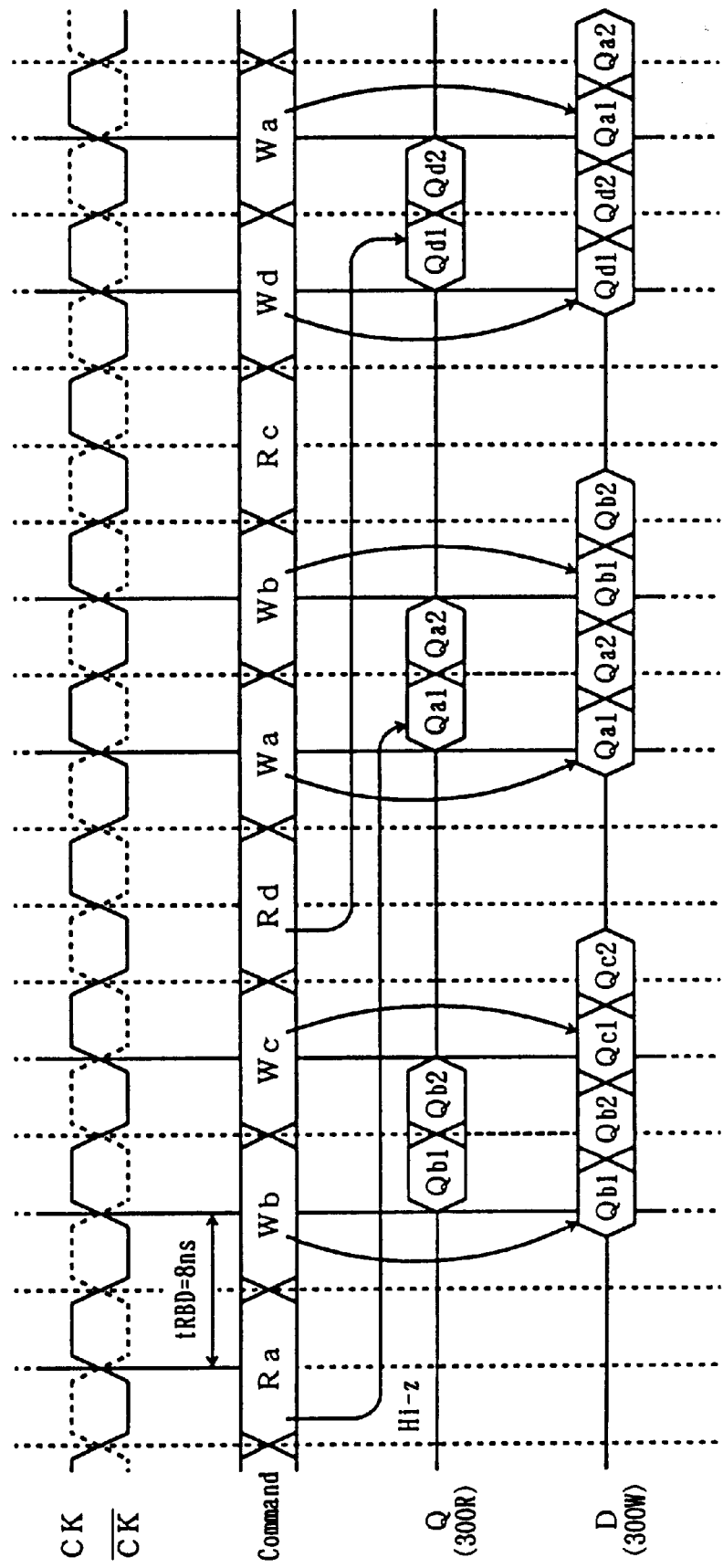
FIG. 32 is a timing chart of an operation of the variation of the third embodiment of the present invention through the seventh embodiments thereof.

FIG. 32 is a timing chart of an operation of the configuration shown in FIG. 12 in which a data read operation on the bank a is performed and data write operations are successively performed with respect to the banks b and c different from the bank a by utilizing the latency period resulting from the above data read operation. The operation shown in FIG. 32 corresponds to that shown in FIG. 19.

As shown in FIG. 32, read data Qa1 and Qa2 are output to the read data bus 300R and simultaneously write data Da1, Da2, Db1 and Db2 are output to the write data bus 300W. In contrast, according to FIG. 19, the write data Da1, Da2, Db1 and Db2 cannot be arranged as shown in FIG. 32 but are required to be located after the write data Qa1 and Qa2. This means that the operation shown in FIG. 19 does not allow the write commands to be arranged as shown in FIG. 32 but needs the null operation period after the read command Rd.

Figure 13:
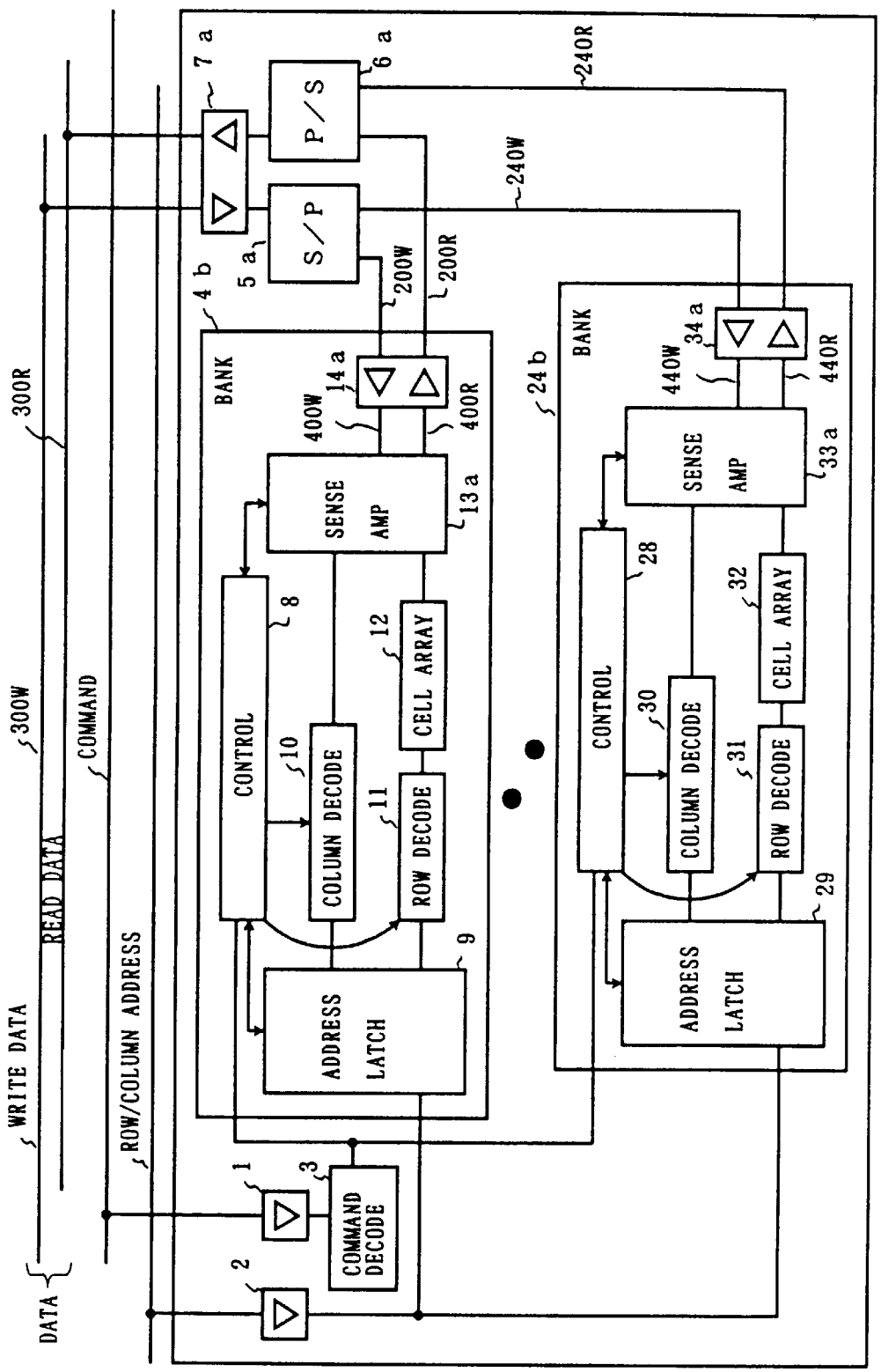
FIG. 13 is a block diagram of a semiconductor integrated circuit memory according to a fourth embodiment of the present invention.

FIG. 13 shows a configuration of a semiconductor integrated circuit memory according to a fourth embodiment of the present invention. In FIG. 13, parts that are the same as those shown in FIG. 12 are given the same reference numbers.

The memory shown in FIG. 13 includes the command input part 1, the address input part 2, the command decoder 3, a bank 4b, a bank 24b, the S/P converter part group 5b, the S/P converter part group 6a, and the data input/output part group 7a. As in the configuration shown in FIG. 12, the peripheral data bus 200 which connects the bank 4b and the data input/output part group 7a is separated into the peripheral write data bus 200W and the peripheral read data bus 200R. Similarly, the peripheral data bus 240 which connects the banks 24b and the data input/output part group 7a is separated into the peripheral write data bus 240W and the peripheral read data bus 240R. Further, in the bank 4b, the core data bus 400 which connects a sense amplifier part 13a and an input/output data latch part 14b is separated into a core write data bus 400W and a core read data bus 400R. Correspondingly, the input/output data latch part 14b has latches which respectively transfer write and read data. Similarly, in the bank 24b, the core data bus 440 which connects a sense amplifier part 33a and an input/output data latch part 34b is separated into a core write data bus 440W and a core read data bus 440R. Correspondingly, the input/output data latch part 34b has latches which respectively transfer write and read data.

The external data bus 300 is separated into the external write data bus 300W and the external read data bus 300R. Hence, the memory shown in FIG. 13 efficiently utilizes the external data write data bus 300W and the external read data bus 300R in the same manners as those of the memory shown in FIG. 12 shown in FIGS. 31 and 32.

Figure 14:
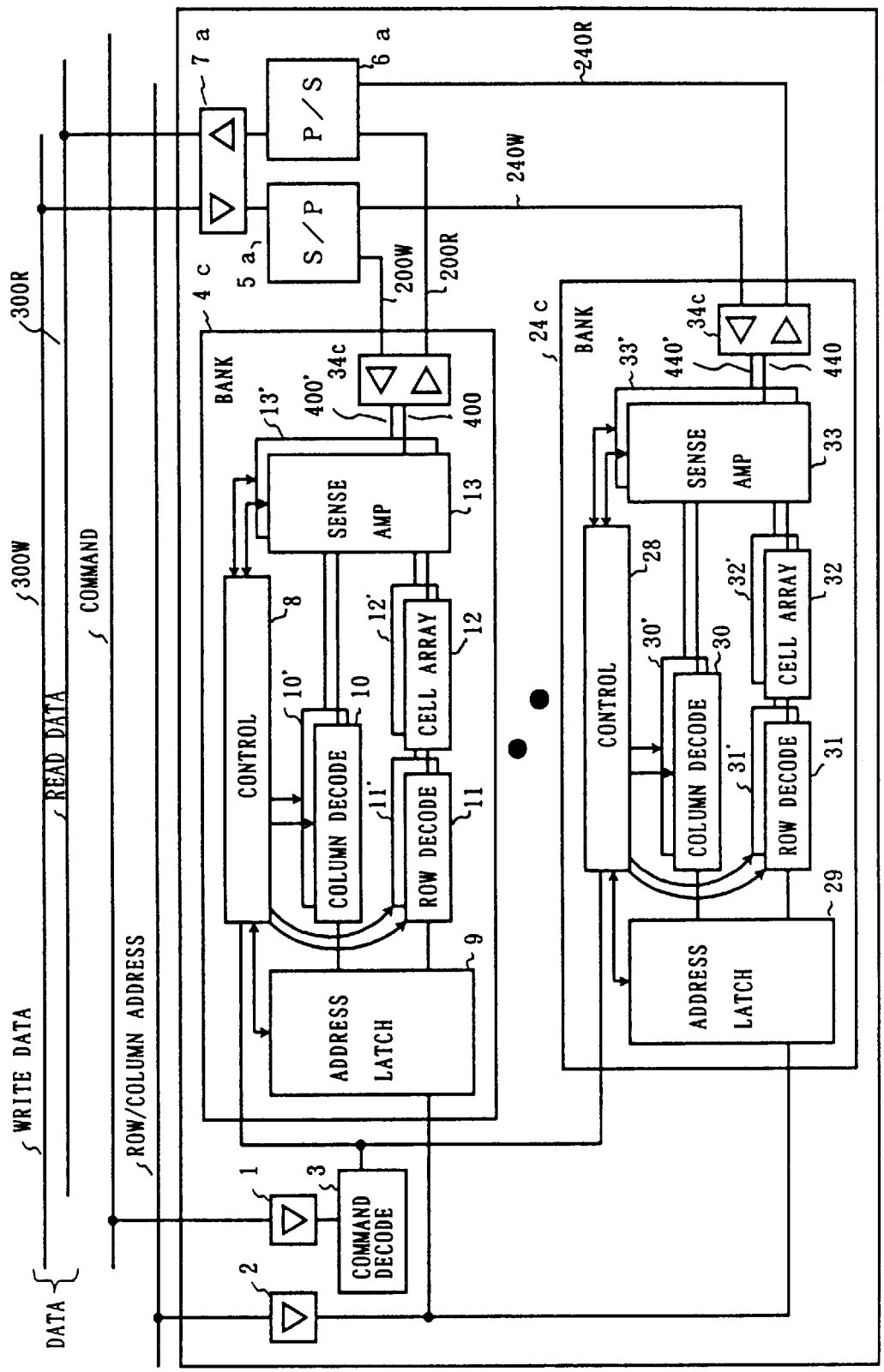
FIG. 14 is a block diagram of a semiconductor integrated circuit memory according to a fifth embodiment of the present invention.

FIG. 14 is a block diagram of a semiconductor integrated circuit memory according to a fifth embodiment of the present invention, in which parts that are the same as those shown in FIG. 13 are given the same reference numbers.

The memory shown in FIG. 14 includes the command input part 1, the address input part 2, the command decoder 3, a bank 4c, a bank 24c, the S/P converter part group 5a, the P/S converter part group 6a and the data input/output part group 7a. As in the configuration shown in FIG. 12, the peripheral data bus which connects the bank 4c and the data input/output part group 7a is separated into the peripheral write data bus 200W and the peripheral read data bus 200R. Thus, an input/output data latch part 14c of the bank 4c has latches which respectively latch write data and read data. Similarly, the peripheral data bus 240 which connects the banks 24c and the data input/output part group 7a is separated into the peripheral write data bus 240W and the peripheral read data bus 240R. Thus, an input/output data latch part 34c of the bank 24c has latches which respectively latch write data and read data.

The bank 4c includes a plurality of memory cell array parts 12 and 12', which may be called sub cell matrixes. Hence, the bank 4c includes, in addition to the column decoder 10, the row decoder 11 and the sense amplifier part 13, a column decoder 10', a row decoder 11' and a sense amplifier part 13'. The parts 10', 11' and 13' are associated with the memory cell array part 12'. The control part 8 of the bank 4c controls, in addition the column decoder 10, the row decoder 11 and the sense amplifier part 13, the column decoder 10', the row decoder 11' and the sense amplifier part 13'. The sense amplifier part 13 is connected to the input/output data latch part 14c by a common core data bus via which write and read data are transferred. Similarly, the sense amplifier part 13' is connected to the input/output data latch part 14c via another common data bus via which write and read data are transferred.

The bank 24c has the same configuration as that of the bank 4c. The bank 24c includes, in addition to the column decode part 30, the row decode part 31, the memory cell array part 32 and the sense amplifier part 33, a column decode part 30', a row decode part 31', a memory cell array part 32' and a sense amplifier part 33'. The input/output data latch part 34c is connected to the sense amplifier 33 by a core data bus 440, and is connected to the sense amplifier 33' by a core data bus 440'.

The memory shown in FIG. 14 efficiently utilizes the external data write data bus 300W and the external read data bus 300R in the same manner as those of the memory shown in FIG. 12 shown in FIGS. 31 and 32.

Figure 15:
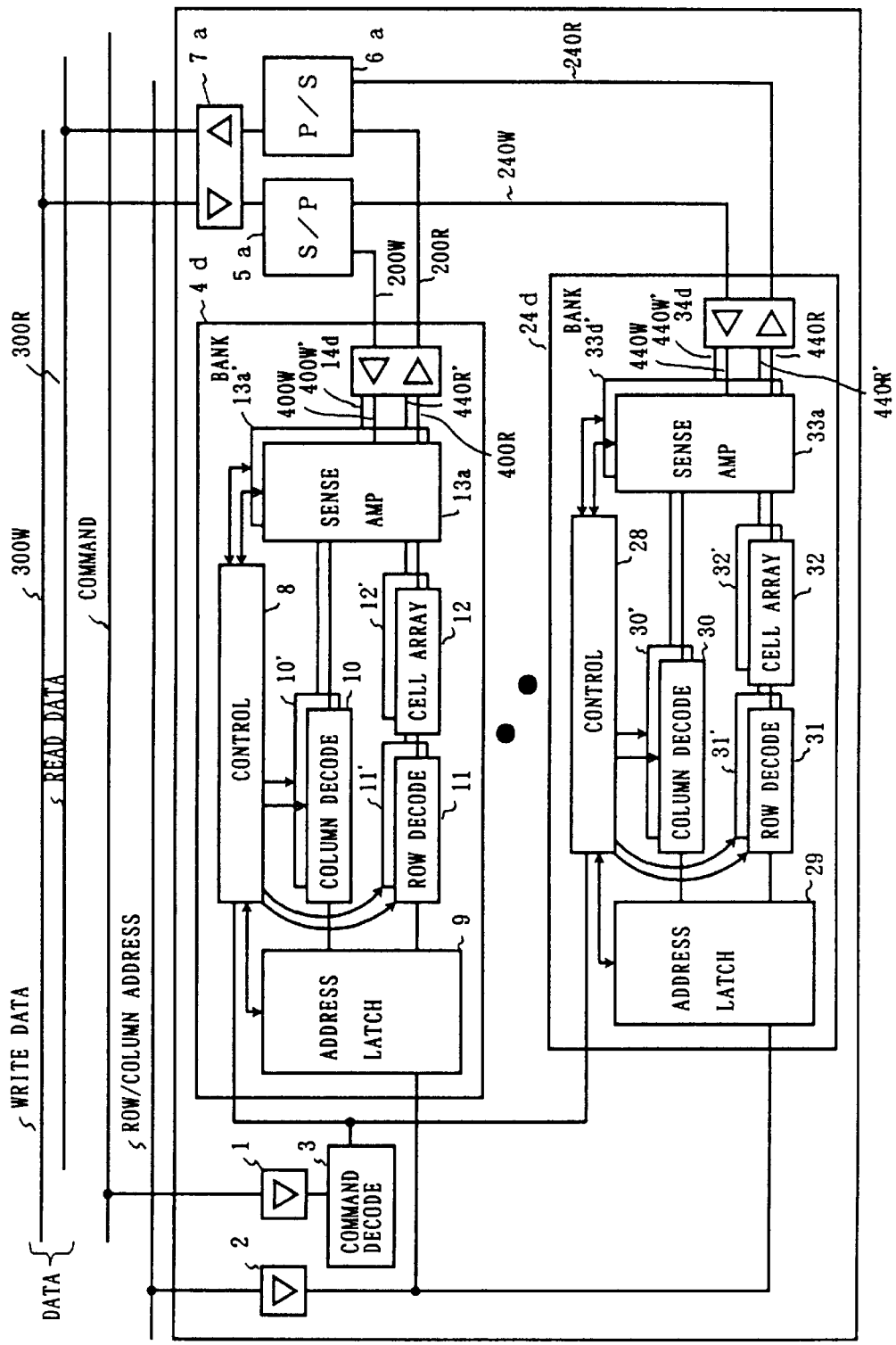
FIG. 15 is a block diagram of a semiconductor integrated circuit memory according to a sixth embodiment of the present invention.

FIG. 15 is a block diagram of a semiconductor integrated circuit memory according to a sixth embodiment of the present invention, in which parts that are the same as those shown in FIG. 14 are given the same reference numbers. The memory shown in FIG. 15 includes banks 4d and 24d. The bank 4d differs from the bank 4c shown in FIG. 14 in that the core data bus 400 provided to the sense amplifier part 13a is separated into a core write data bus 400W and a core read data bus 400R and the core data bus 400' provided to the sense amplifier part 13a' is separated into a core write data bus 400W' and a core read data bus 400R'. Similarly, the bank 24d includes core write data buses 440W and 440W' and core read data buses 440R and 440R'.

The memory shown in FIG. 15 efficiently utilizes the external data write data bus 300W and the external read data bus 300R in the same manner as those of the memory shown in FIG. 12 shown in FIGS. 31 and 32.

Figure 16:
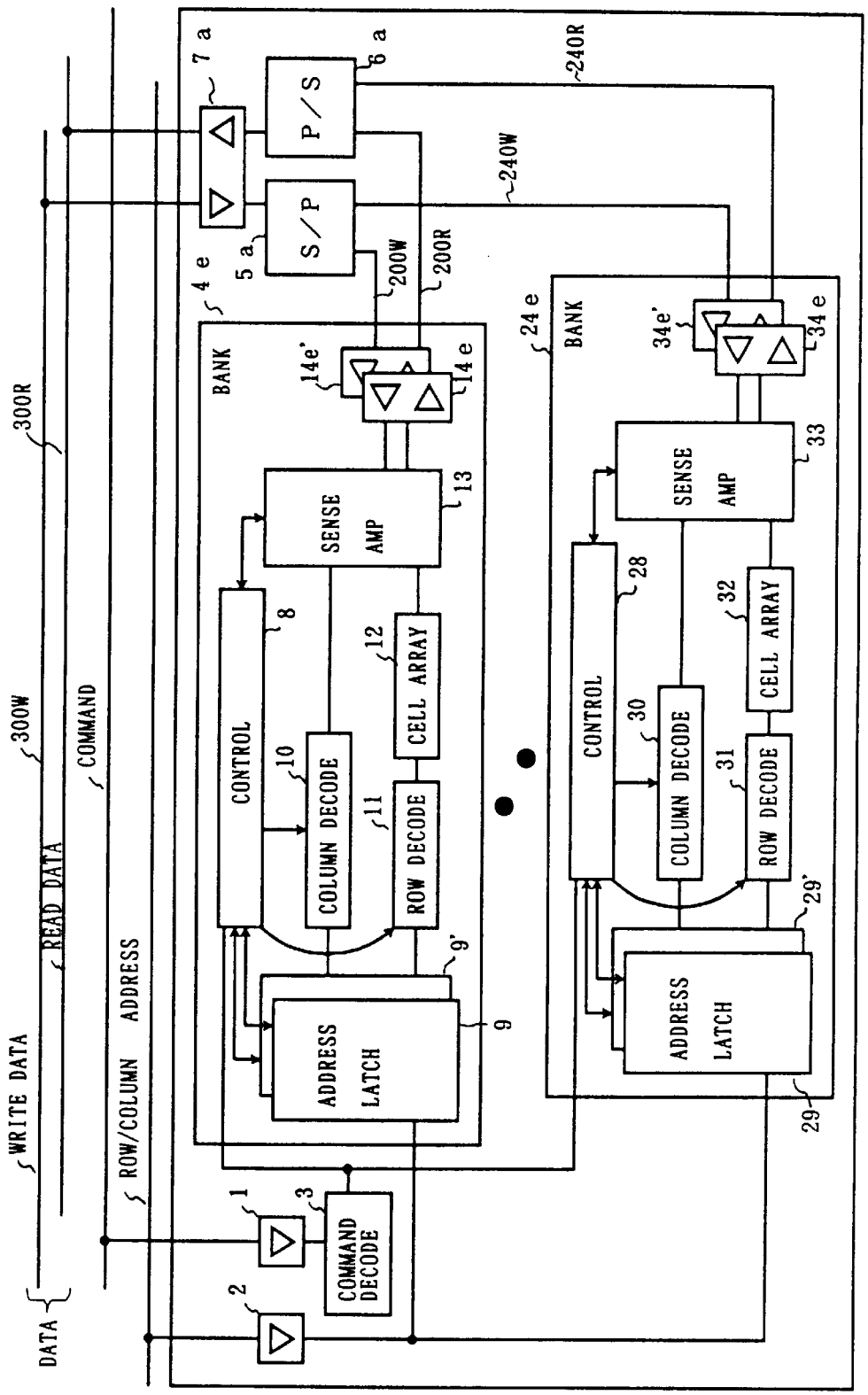
FIG. 16 is a block diagram of a semiconductor integrated circuit memory according to a seventh embodiment of the present invention.

FIG. 16 is a block diagram of a semiconductor integrated circuit memory according to a seventh embodiment of the present invention, in which parts that are the same as those shown in FIG. 13 are given the same reference numbers. The memory shown in FIG. 16 includes a bank 4e and a bank 24e. The bank 4e includes an address latch part 9' and an input/output data latch part 14e' in addition to the address latch part 9 and the input/output data latch part 14e. Similarly, the bank 24e includes an address latch part 29' and an input/output data latch part 34e' in addition to the address latch part 29 and the input/output data latch part 34e.

When a write command is input to the bank from which read data is being read by the preceding read command and a read address related to the present read command is latched in the address latch part 9e, a write address that is input subsequent to the write command is latched in the address latch part 9e'. Further, the write command related to the write address latched in the address latch part 9e' and associated write data are temporarily stored in the control part 8. After the data read operation in progress is finished, the data write operation is performed.

The memory shown in FIG. 16 efficiently utilizes the external data write data bus 300W and the external read data bus 300R in the same manner as those of the memory shown in FIG. 12 shown in FIGS. 31 and 32. Hence, it is possible to arbitrarily apply different commands to the same bank without taking into consideration the operation which is in progress.

Figure 24:
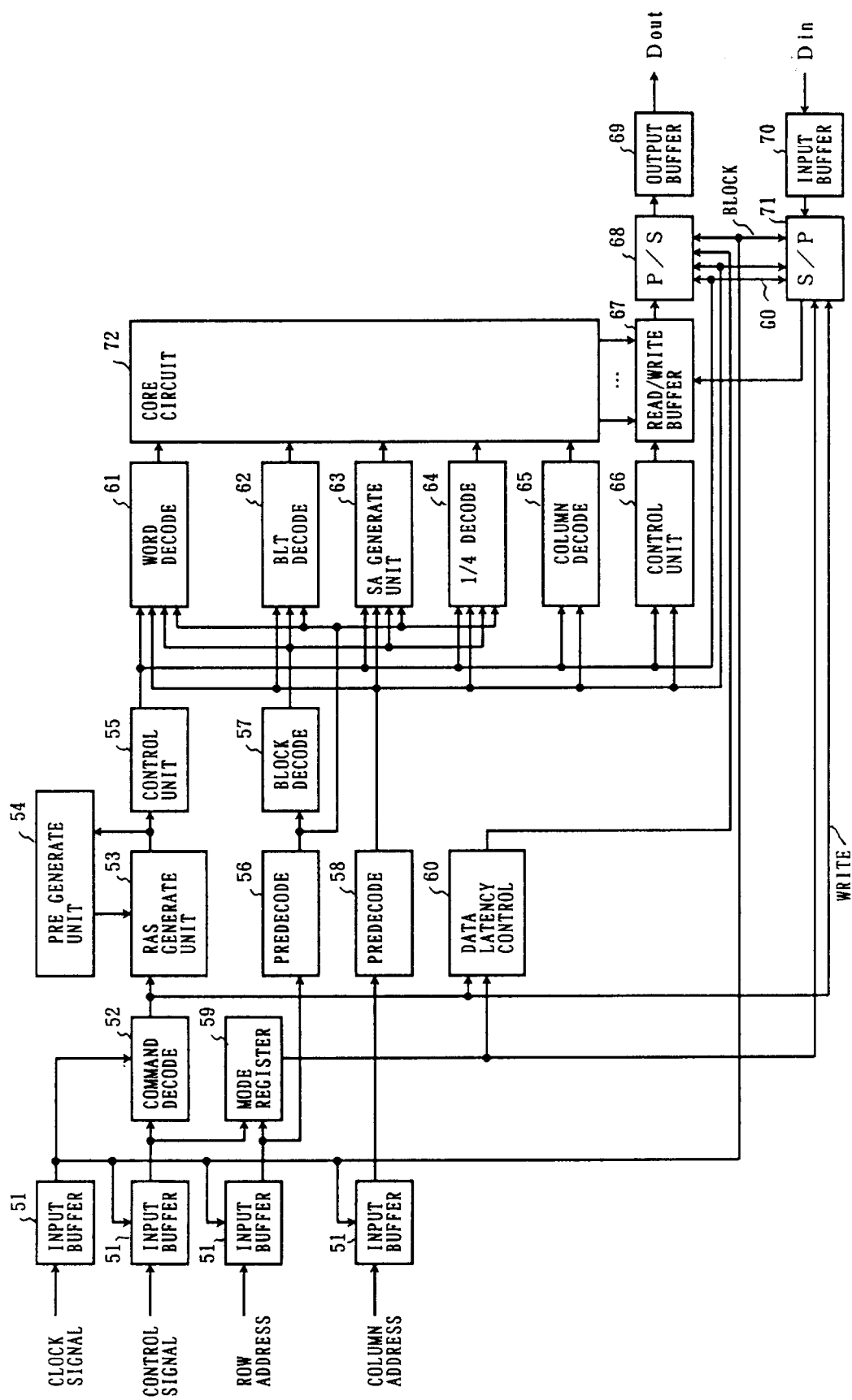
FIG. 24 is a block diagram of a structure of an SDRAM configured by the present invention.

FIG. 24 is a block diagram of an SDRAM, which is an example of the semiconductor integrated circuit memory of the present invention.

The SDRAM includes a plurality of input buffers 51, a command decoder 52, a RAS generation unit 53, a precharge signal (PRE) generation unit 54, a control unit 55, a predecoder 56, a block decoder 57, a predecoder 58, a mode register 59, a data latency controller 60, a word decoder 61, a bit line transfer signal (BLT) decoder 62, a sense amplifier drive signal (SA) generation unit 63, a ¼ decoder 64, a column decoder 65, a control unit 66, a read/write buffer 67, a parallel-to-serial (P/S) converter 68, an output buffer 69, an input buffer 70, a serial-to-parallel (S/P) converter 71, and a core circuit 72. The SDRAM shown in FIG. 24 can include any of the aforementioned embodiments of the present invention and variations thereof.

The command decoder 52 and the mode register 59 correspond to the aforementioned command decoder 3. The precharge signal generation unit 54, the RAS generation unit 53, the control unit 55, the data latency controller 60, and the control unit 60 correspond to the aforementioned control parts 8 and 24.

The predecoder 56, the block decoder 57 and the predecoder 58 corresponds to the address latch parts 9 and 29 used in the first through sixth embodiments of the present invention, and correspond to the address latch parts 9, 9', 29 and 29' used in the seventh embodiment thereof.

The word decoder 61, the bit line decoder 62, the sense amplifier drive signal generation unit 63 and the ¼ decoder 64 the row decoders 11 and 31 used in the first through fourth and seventh embodiments of the present invention, and correspond to the row decoders 11, 11', 31 and 31' used in the fifth and sixth embodiments thereof.

The column decoder 65 corresponds to the column decoders 10 and 30 used in the first through fourth embodiments of the present invention, and corresponds to the column decoders 10, 10', 30 and 30' used in the fifth and sixth embodiments thereof.

The read/write buffer 67 corresponds to the input/output data latch parts 14 and 34 used in the first and second embodiments of the present invention, and corresponds to the input/output data latch parts (14a and 34a), (14b and 34b), (14c and 34c), (14d and 34d), (14e, 14e', 34e, 34e') in the third, fourth, fifth, sixth and seventh embodiments thereof, respectively.

The P/S converter 68 corresponds to the P/S converter 5 used in the first embodiment of the present invention, and to the P/S converter group 5a in the second through seventh embodiments thereof. The S/P converter 71 corresponds to the S/P converter 6 used in the first embodiment of the present invention, and to the S/P converter group 6a in the second through seventh embodiments thereof.

The core circuit 72 corresponds to the memory cell array parts 12 and 32, and the sense amplifier parts 13 and 33 in the first through third and seventh embodiments of the present invention. The memory cell array parts 12 and 32 and the sense amplifier parts 13a and 33a of the fourth embodiment of the present invention form the core circuit 72. The memory cell array parts 12, 12', 32 and 32' and the sense amplifier parts 13, 13', 33 and 33' of the fifth embodiment of the present invention form the core circuit 72. The memory cell array parts 12, 12', 32 and 32' and the sense amplifier parts 13a, 13a', 33a and 33a' of the sixth embodiment of the present invention form the core circuit 72.

The SDRAM shown in FIG. 24 operates so that the external data bus can efficiently be utilized by separately controlling the data input and output in each bank.

More particularly, the given control signals, which are an activation command ACT and a read command RD directed to one of the banks of the SDRAM, are input to the corresponding input buffer 51 from the outside of the SDRAM. Each control signal can be defined by a combination of the predetermined signals such as a row address strobe signal /RAS, a column address strobe signal /CAS, a write enable signal /WE and a chip select signal /CS (these signals are not illustrated in FIG. 24 for the sake of simplicity). Then, the data read operation on the specified bank is initiated. The control signals input to the corresponding input buffer 51 are decoded by the command decoder 52, and decoded signals control the RAS generation unit 53 and the data latency controller 60. The row address signal is applied to the mode register 59 via the corresponding input buffer 51. The column address signal is applied to the predecoder 58 via the corresponding input buffer 51.

The RAS generation unit generates an internal row address strobe signal RASZ signal in response to receipt of the activation command ACT. The signal RASZ is a signal which instructs data stored in the memory cell array to be read by the sense amplifiers, and is supplied to the control unit 55.

The control unit 55 receives the signal RASZ, and controls the word decoder 61, the BLT decoder 62, the SA generation unit 63 and the ¼ decoder 64, so that word line select signals MW and SW, the bit line transfer signal BLT and sense amplifier drive signals SA1 and SA2 are generated at appropriate timings. Further, the control unit 55 generates signals to be supplied to the controller 66, as will be described later.

The predecoder 56 latches and predecodes the supplied row address. The predecoded row address is supplied to the block decoder 57 and to the word decoder 61, the BLT decoder 62 and the SA generation unit 63. The block decoder 57 selects one of a plurality of memory blocks arranged in each bank in the core circuit 72. The word decoder 61, the BLT decoder 62 and the SA generation unit 63 operates in only the selected memory block, and reads data from the memory cells by the sense amplifiers.

The control unit 66 is supplied with the read command RD and thus generates a peripheral column address strobe signal CASZ. The signal CASZ is an instruction signal which reads data from the sense amplifiers and outputs the read data to the read/write buffer 67. The control unit 66 controls the column decoder 65 and generates the column line select signal CL. A detailed configuration of the control unit 66 will be described later.

The predecoder 58 latches and predecodes the supplied column address. The predecoded address signal is supplied to the column decoder 65. Then, the column decoder 65 supplies the column line select signal CL to the column specified by the decoded column address, and reads parallel data from the sense amplifiers connected to the selected column. The parallel data thus read are supplied to the read/write buffer 67.

The read/write buffer 67 latches and amplifies the received parallel data. Then, the parallel data is converted into serial data by the P/S converter 68, and is output to the outside of the SDRAM via the output buffer 69.

The data thus read is output to the external data bus when the given time corresponding to the latency period elapses after the read command RD is latched by the control unit 66. In the SDRAM shown in FIG. 24, the external data bus is controlled as has been described. More particularly, the control units 55 and 66 are provided in each of the banks and there is provided the latency controller 60 which manages and controls the latency. Hence, the external data bus is not occupied by the data read operation in progress. That is, the data write operation can be performed by utilizing the latency period resulting from the data read operation in progress. It is also possible to simultaneously output read and write data to the external data bus that is separated into the read and write data buses.

More particularly, the above operation can be accomplished so that the control units 55 and 66 and the data latency controller 60 control the read/write buffer 67, the P/S converter 68, the S/P converter 71, the output buffer 69 and the input buffer 70. During the latency period resulting from the data read operation, the input buffer 70 is enabled. Further, the output of the S/P converter 71 is turned ON while the output of the P/S converter 68 is turned OFF. Write data supplied from the outside of the SDRAM is latched in the read/write buffer 67, and is then written into the core circuit 72. Further, the write command WT and the write address are supplied with the SDRAM together with the write data.

Figure 25:
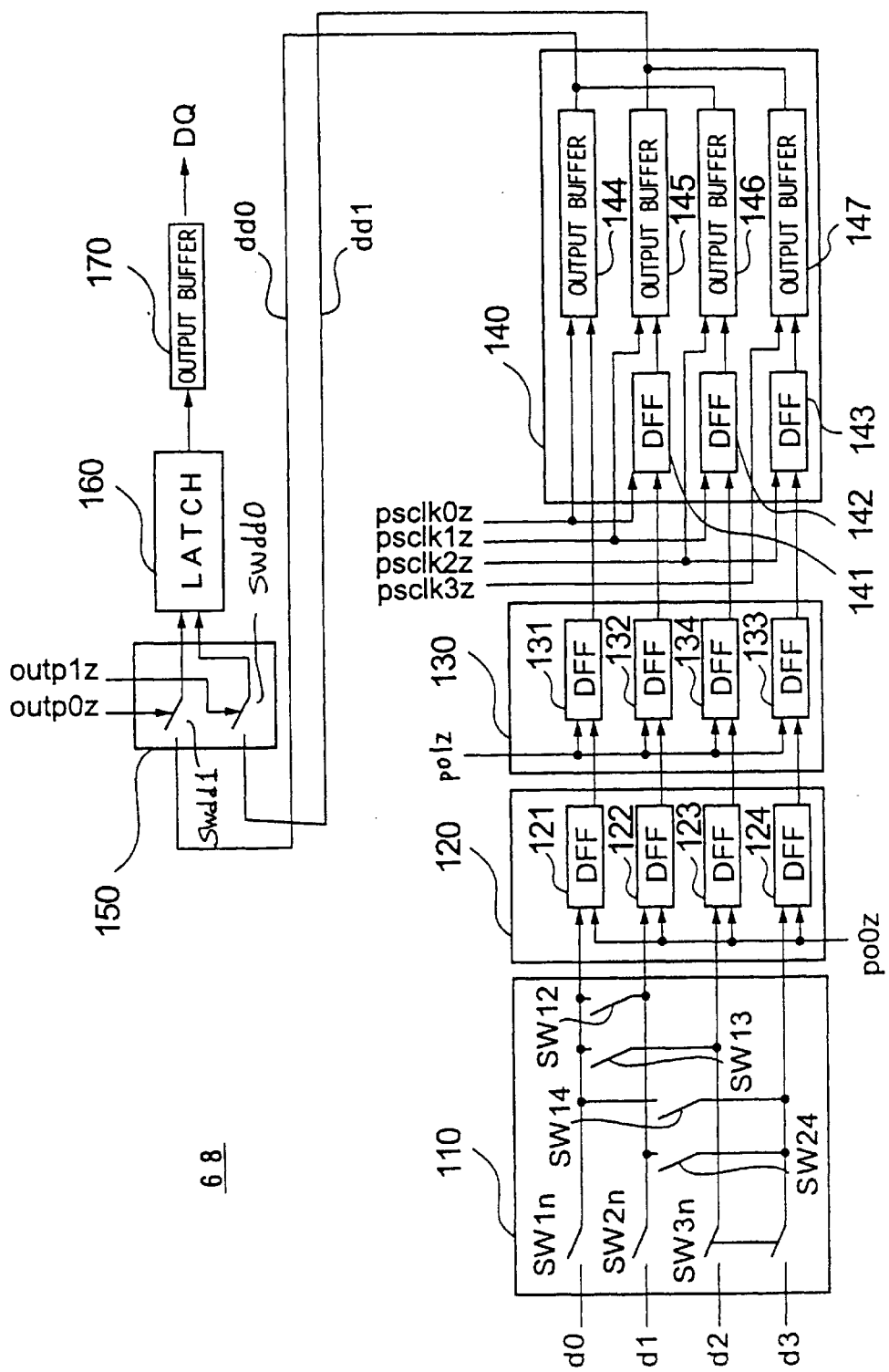
FIG. 25 is a block diagram of a parallel-to-serial converter shown in FIG. 24.

FIG. 25 is a block diagram of the P/S converter 68 controlled by the control units 55 and 66 and the data latency controller 60. The P/S converter 68 includes a data bus switch unit 110, a first register unit 120, a second register unit 130, a 4-to-2 converter 140, a data output timing circuit 150, a latch circuit 160 and an output buffer 170.

The data bus switch 110 receives parallel data consisting of, for example, four bits, from the read/write buffer 67, and changes a connection between a four-bit input data bus and a four-bit output data bus on the basis of a burst-length signal BL and a part of the column address. The first register group 120 is connected to the four-bit output data bus of the data bus switch 110. The second register group 130 is connected to the four-bit output data bus of the first register group 120. The 4-to-2 converter 140 converts the four-bit parallel data from the second register group 130 into two-bit parallel data. The data output timing circuit 150 and the latch circuit 160 function to convert the 2-bit parallel data into one-bit serial data.

More particularly, the data bus switch 110 includes switches sw1n, sw2n, sw3n provided to data bus lines d0, d1, d2 and d3 of the four-bit data bus as shown in FIG. 25. Further, the data bus switch 110 includes a switch sw24 for making a connection between the data bus lines d1 and d3, a switch sw14 for making a connection between the data bus lines d0 and d3, a switch sw13 for making a connection between the data bus lines d0 and d2, and a switch sw12 for making a connection between the data bus lines d0 and d1. The above switches are controlled by the burst-length signal BL and parts of the column address signal caa0z and caa1z.

FIG. 26 is a diagram showing states of the switches of the data bus switch unit 110, which states are set when the burst length is equal to 1, 2 and 4. When the burst-length signal BL indicates a burst length of 4, the data bus lines d0–d4 on the input side are connected to data bus lines d0–d4' on the output side. That is, in the above case, the switches sw1n, sw2n and sw3n are ON (closed) and the switches sw24, sw14, sw13 and sw12 are OFF (open).

When the burst-length signal BL indicates a burst length of 2, the P/S converter shown in FIG. 25 is designed so that the data signals transferred over the data bus lines d0' and d1' are transmitted to the outside of the SDRAM. Hence, in this case, a pair of data bus lines d0 or d1 or another pair of data bus lines d2 and d2 is transmitted to the data bus lines d0' and d1' in accordance with the logic value of the column address signal caa0z. More particularly, when the data bus lines d0 and d1 should be respectively connected to the data bus lines d0' and d1', the column address signal caa0z is set to the low level. Thus, the switches sw1n, sw2n and sw3n are turned ON, while the switches sw24, sw14, sw13 and sw12 are turned OFF. When the data bus lines d2 and d3 should be respectively connected to the data bus lines d0' and d1', the column address signal caa0z is set to the high level. Hence, the switches sw3n, sw24 and sw13 are turned ON, and the switches sw1n sw2n, sw14 and sw12 are turned OFF. Hence, data on the data bus line d2 is transferred to the data bus line d0', and the data on the data bus line d3 is transferred to the data bus line d1'. When the burst length is equal to 2, the other column address signal caa1z is not used to control the switches of the data bus switch unit 110.

When the burst-length signal BL indicates a burst length of 1, one of the data bus lines d0–d3 is selected and transferred to the data bus line d0' from which the selected bit is output to the outside of the SDRAM. The above selection is performed by the combination of the values of the column address signals caa0z and caa1z. More particularly, when data on the data bus line d0 is selected, the column address signals caa0z and caa1z are both set to the low level. Hence, the switches s21n, sw2n and sw3n are turned ON, and the switches sw24, sw14, sw13 and sw12 are turned OFF. In this case, data on the data bus line d0 is transferred to the data bus line d0'. When data on the data bus line d1 is selected, the column address signals caa0z and caa1z are respectively set to the high and low levels. Thus, the switches sw2n, sw3n and sw12 are turned ON, and the switches sw1n, sw24, sw14 and sw13 are turned OFF. Thus, the data on the data bus line d1 is transferred to the data bus line d0' via the switch sw12. When data on the data bus line d2 or d3 is selected, the switches are turned ON and OFF in accordance with the table shown in FIG. 26.

The parallel data d0', d1', d2' and d3' are transferred to the first register unit 120 and the second register unit 130. The first register unit 120 includes four delayed flip-flops (DFF) 121, 122, 123 and 124, which latch data in accordance with a first control signal po0z. The second register 130 includes four delayed flip-flops (DFF) 131, 132, 133 and 134, which latch in accordance with a second control signal po1z.

Figure 27:
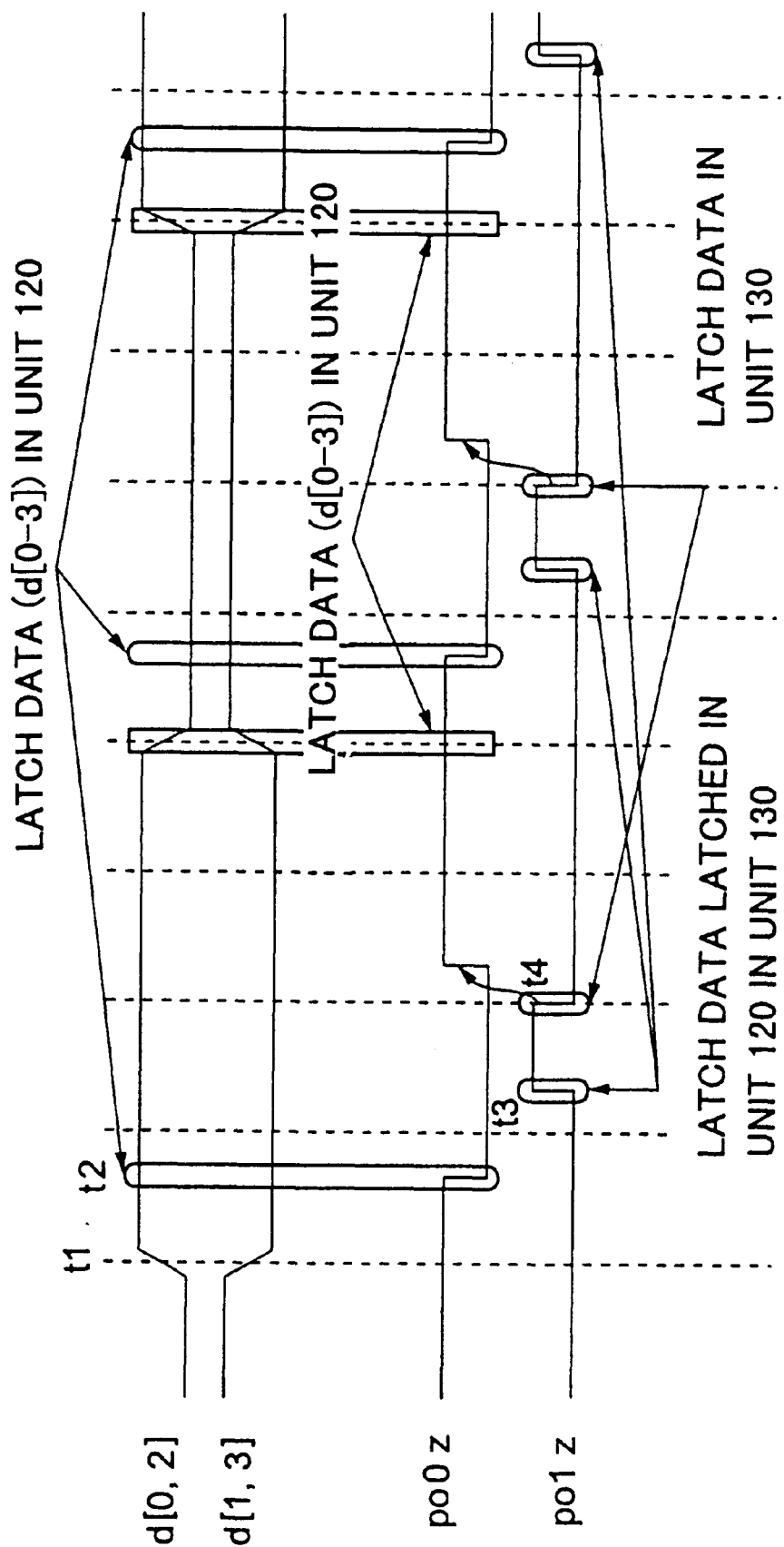
FIG. 27 is a timing chart showing operations of first and second register units shown in FIG. 25.

FIG. 27 is a timing chart of operations of the first and second register units 120 and 130. In FIG. 27, d[0, 2] means data on the data bus lines d0' and d2', and d[1, 3] means data on the data bus lines d1' and d3'.

At time t1 shown in FIG. 27, parallel data appears on the data bus lines d0', d1', d2' and d3'. At time t2, the first control signal po0z is changed to the low level from the high level, and the flip-flops 121–124 of the first register unit 120 latch the data on the data bus lines d0'–d3', respectively. At time t3, the second control signal is changed from the low level to the high level, and the flip-flops 131–134 of the second register unit 130 receive the data output from the flip-flops 121–124, respectively. At time t4, the received data are latched in the flip-flops 131–134. Then, the first control signal is changed from the low level to the high level, and the flip-flops 121–124 become ready to receive next data on the data bus lines d0'–d3'. As described above, the parallel data on the data bus lines d0', d1', d2' and d3' are sequentially transferred to the first register unit 120 and the second register unit 130.

The data latched in the second register unit 130 are transmitted to the 4-to-2 converter 140, which converts the four-bit parallel data into two-bit parallel data. The 4-to-2 converter 140 includes flip-flops (DFF) 141, 142 and 143 and output buffer circuits 144–147. The 4-to-2 converter 140 is supplied with four control clock signals psclk0z–psclk3z, which control the output timings of the output buffer circuit 144–147 and the data latch timings of the flip-flops 141–143. The output lines of the output buffer circuits 144 and 146 are connected to a node dd0 in a wired-OR fashion. Similarly, the output lines of the output buffer circuits 145 and 147 are connected to a node dd1 in the wired-OR fashion. When data is output from the output buffer circuit 144, the output end of the output buffer circuit 146 is set to the high-impedance state. When data is output from the output buffer circuit 146, the output end of the output buffer circuit 144 is set to the high-impedance state. Then, two-bit data are output to the nodes dd0 and dd1 from the 4-to-2 converter 140 and is transferred to the data output timing circuit 150. The circuit 150 includes two switches swdd0 and swdd1, which are controlled by output control clock signals outp0z and outp1z. The circuit 150 operates as follows. The switch swdd0 is closed so that the data bit appearing at the node dd0 is transferred to the latch circuit 160 of the next stage. Then, the switch swdd1 is closed so that the data bit appearing at the node dd1 is transferred to the latch circuit 160. The latch circuit 160 latches the input data, and changes the level of the input data to an appropriate level. Then, the level-converted data is output, as output data DQ, to the outside of the SDRAM via the output buffer 170.

Figure 28:
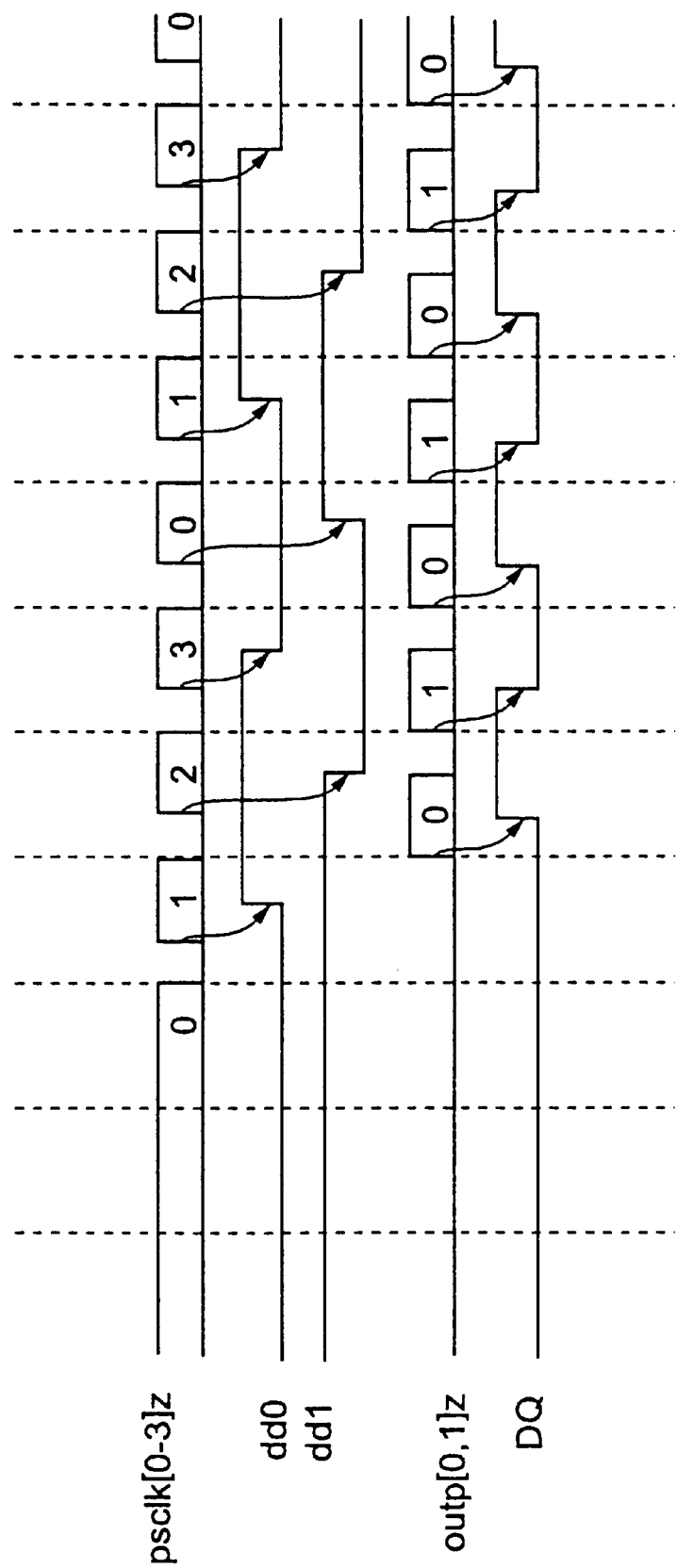
FIG. 28 is a timing chart of an operation of a circuit part between a 4-to-2 converter and a latch circuit shown in FIG. 25.

FIG. 28 is a timing chart of operations of the section between the 4-to-2 converter 140 and the latch circuit 160 when the burst-length signal BL indicates a burst length of 4.

Figure 34:
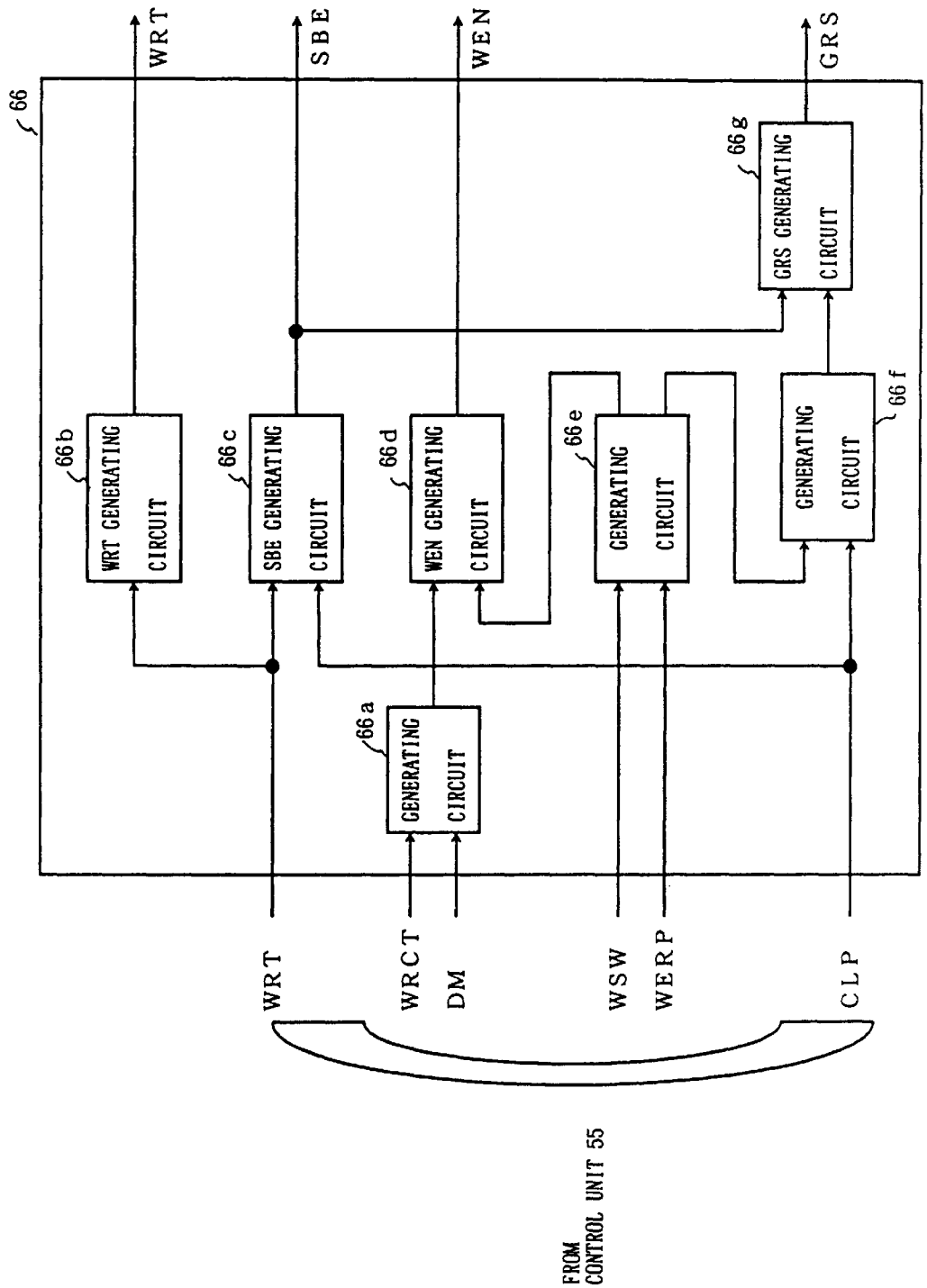
FIG. 34 is a block diagram of a controller shown in FIGS. 24 and 33.

In the initial state, the read data are latched in the flip-flops 131–134 of the second register unit 130. As shown in FIG. 28, the control clock signals psclk0z–psclk3z serially switch to the high level in that order. When the control clock signal psclk0z switches to the high level, the data received from the flip-flop 131 and stored in the output buffer circuit 144 is read therefrom and is output to the node dd0. Simultaneously, the data output from the flip-flop 132 is latched in the flip-flop 141. Next, the signal psclk1z switches to the high level, the data received from the flip-flop 141 and stored in the output buffer circuit 145 is read therefrom and is output to the node d11. Simultaneously, the data output from the flip-flop 133 is latched in the flip-flop 142. The above operation is repeated, and the nodes dd0 and dd1 are alternately supplied with data newly read from the 4-to-2 converter 140, as shown in FIG. 34.

The flip-flops 141–143 of the 4-to-2 converter 140 are provided so that the next data can be latched in the second register unit 130 while the 4-to-2 converter 140 is performing the 4-to-2 converting operation. Hence, data can serially be output via the data output terminal DQ without any interruption.

The output control clock signals outp0z and outp1z which control the operation of the data output timing signal 150 alternately switch to the high level, as shown in FIG. 28. When the new data appears at the node dd0, the output control clock signal outp0z switches to the high level after a given time, and the switch swdd0 is turned ON. Thus, the data at the node dd0 is transferred to the latch circuit 160. When the new data appears at the node dd1, the output control clock signal outp1z switches to the high level after the given time, and the switch swdd1 is turned ON. Thus, the data at the node dd1 is transferred to the latch circuit 160. The above operation is repeatedly performed, so that the data at the nodes dd0 and dd1 can be alternately transmitted to the latch circuit 160 and the 2-to-1 bit conversion can be accomplished.

FIGS. 29A and 29B show the status of the clock signals psclk0z–psclk3z and the output control signals outp0z and outp1z obtained when the burst length signal BL indicates a burst length of 1, 2 or 4.

The P/S converter 68 shown in FIG. 25 converts the four-bit data into the two-bit data by the 4-to-2 converter 140, and converts the two-bit data into the one-bit data by the data output timing circuit 150 and the latch circuit 160. That is, the parallel-to-serial conversion is performed by the two-stage operation.

It is possible to omit the 4-to-2 converter 140 and directly supply the four-bit data into the data output timing circuit 150. In this case, the parallel-to-serial conversion is performed by the single-stage operation. In this case, the data output timing circuit 150 includes four switches, which are sequentially turned ON in response to four output control clock signals. The single-stage arrangement is simpler than the two-stage arrangement. However, it may become more difficult to generate the four output control clock signals as the frequency of the clock signals becomes higher. In such a case, the two-stage arrangement is advantageous to the single-stage arrangement.

Figure 30:
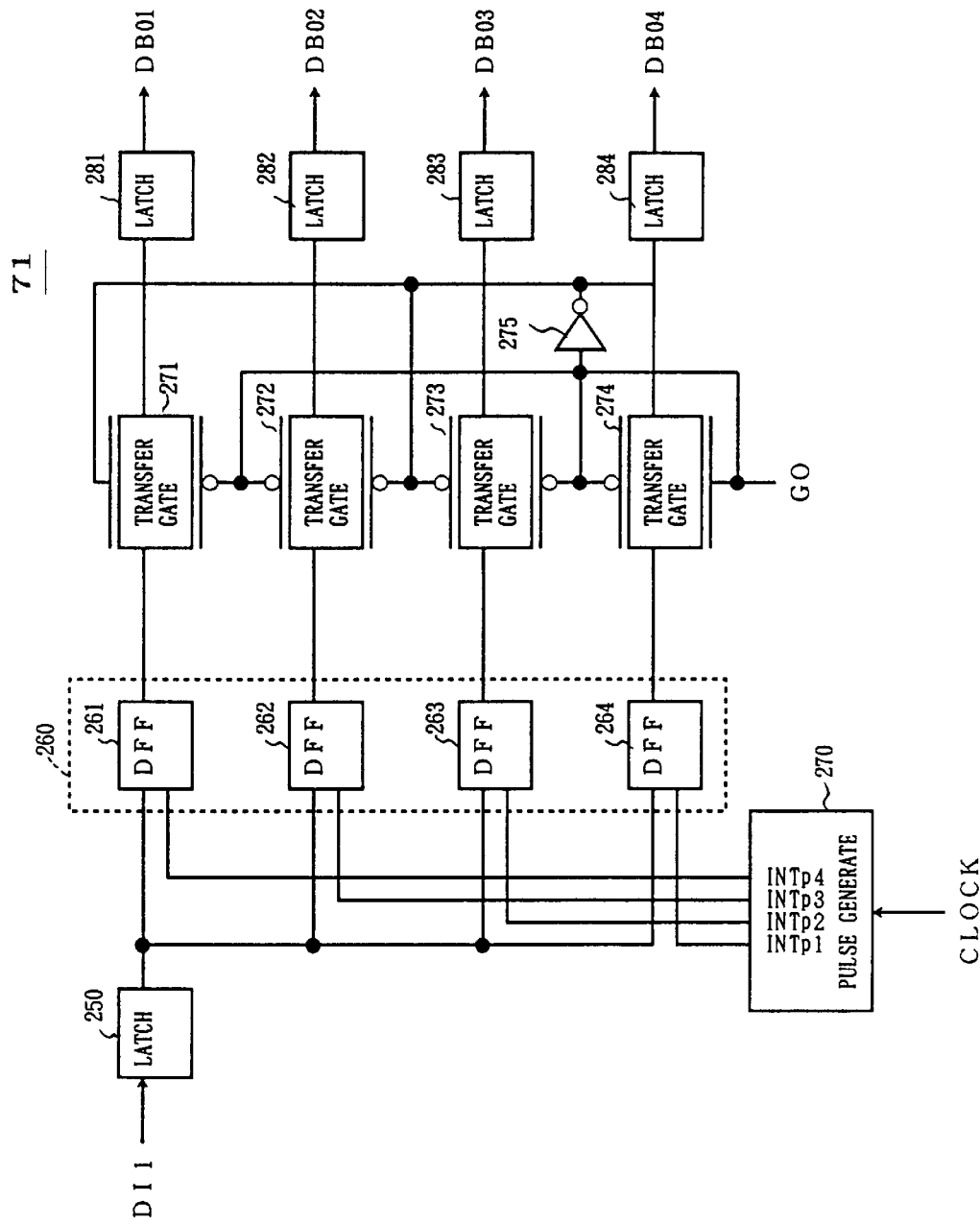
FIG. 30 is a block diagram of a serial-to-parallel converter shown in FIG. 24.

FIG. 30 is a circuit diagram of the S/P converter 71 shown in FIG. 24. The converter 71 is made up of a latch circuit 250, an output register unit 260, a pulse generating circuit 270, transfer gates 271–274, an inverter 275 and latch circuits 281–284. The latch circuit 200 latches the serial data supplied from the outside of the SDRAM. The register unit 260 includes four flip-flops (DFF) 261–264, and serially latch the serial data latched in the latch circuit 250 so that four-bit parallel data can be output. The pulse generating circuit 270 generates timings at which the flip-flops 261–264 respectively latch the corresponding data. The transfer gates 271–274 respectively gate the corresponding bits of the four-bit parallel data from the register unit 260. The latch circuit 281–284 respectively latch and amplify the corresponding bits of the four-bit parallel data from the transfer gates 271–274.

When serial data DI is applied to the P/S converter 71, the latch circuit 250 serially latches the serial data DI and transmits it to the register 250. The pulse generating circuit 270 derives clock signals intp1–intp4 from a clock signal, a signal indicative of the write operation from the command decoder 52 shown in FIG. 24, the burst-length signal BL from the mode register 59, and the predetermined control signals from the data latency controller 60 and the control units 55 and 66. The clock signals intp1–intp4 are switched to the high level in an order of intp4→intp3→intp2→intp1.

The register unit 260 latch the serial data form the latch circuit 250 in accordance with the clock signals intp1–intp4, and outputs the four-bit parallel data to the transfer gates 271–274. A control signal GO is applied to the transfer gates 271–274 from the data latency controller or the control unit 55 or 66, and the four-bit parallel data is allowed to simultaneously pass through the transfer gates 271–274. Then, the four-bit parallel data thus obtained are output, as write data DB01–DB04, to the core circuit 72 via the latch circuit 281–284.

Figure 33:
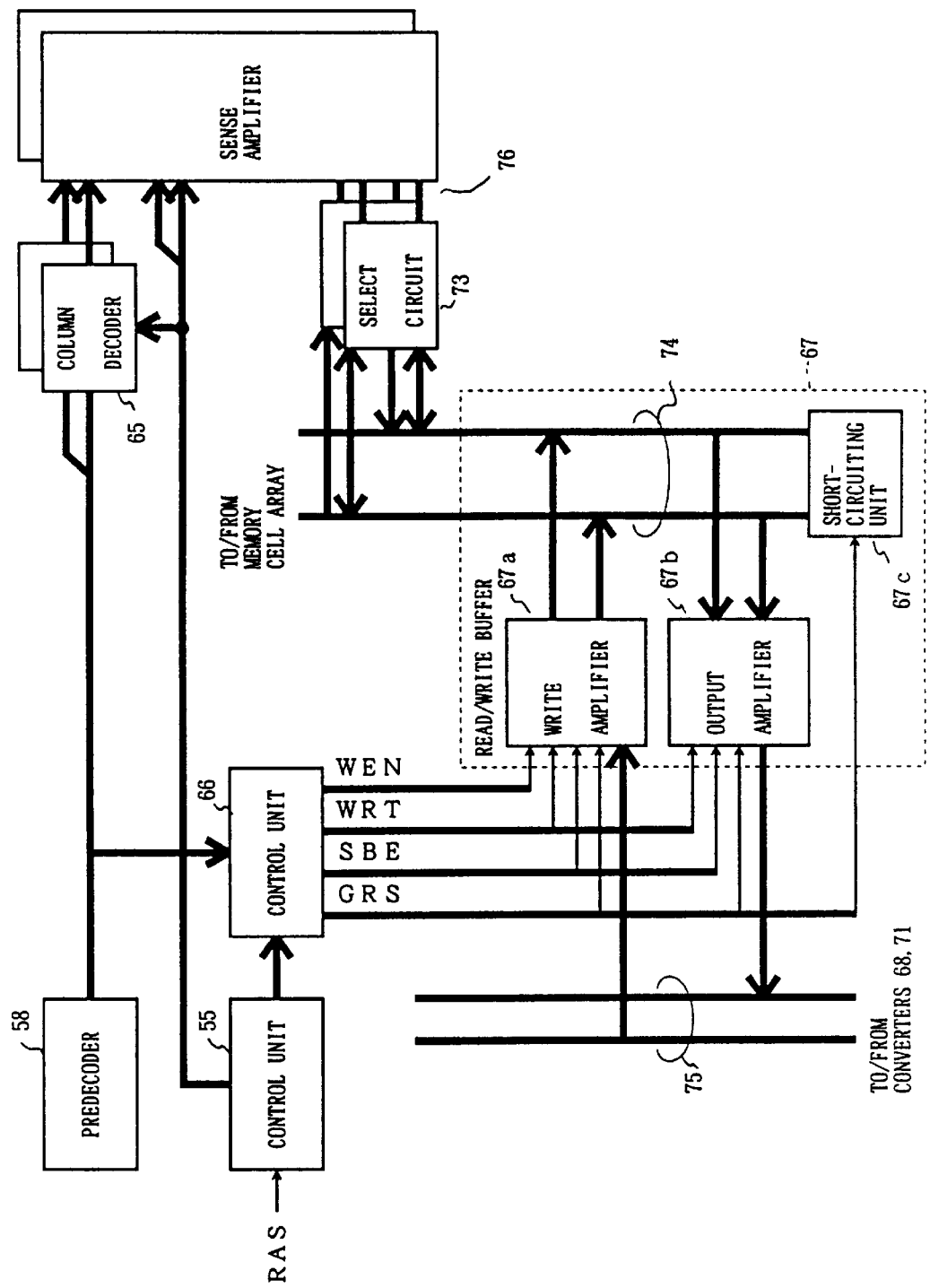
FIG. 33 is a block diagram of a read/write buffer shown in FIG. 24.

FIG. 33 is a block diagram of a structure of the read/write buffer 67 shown in FIG. 24, and FIG. 34 is a block diagram of a structure of the controller 66 shown in FIGS. 24 and 33. In FIGS. 33 and 34, parts that are the same as those shown in the previously described figures are given the same reference numbers.

Referring to FIG. 33, the read/write buffer 67 is made up of a write amplifier 67a, an output amplifier 67b, and a short-circuiting unit 67c. The write amplifier 67a is controlled by signals WEN, WRT, SBE and GRS supplied from the control unit 66, and write data on a peripheral data bus 75 into a core data bus 74. The peripheral data bus 75 is connected to the P/S converter 68 and the S/P converter 71 shown in FIG. 24. The core data bus 74 is connected to the memory cell array (not shown in FIG. 33) provided in the core circuit 72 shown in FIG. 24. The output amplifier 67a is controlled by the signals WRT, WBE and GRS supplied from the control unit 66, and amplifies data on the core data bus 74 and writes amplified data into the peripheral data bus 75. The short-circuiting unit 67c short-circuits a pair of data bus lines of the data bus 74.

A plurality of select circuits 73 are provided to respective sense amplifiers via data buses provided therebetween, and select data bus lines which receive data from the sense amplifiers.

Referring to FIG. 34, the control unit 66 receives control signals WRT, WSW, WRCT, DM, WERP and CLP from the control unit 55 and generates therefrom control signals WRT, SBE, WEN and GRS. The control signal WRT indicates that the related bank is in the write state. The control signal WSW lags behind the control signal WRT by a given time. The control signal WRCT is a signal for determining whether the related bank is in a write mask state at the time of the write state. The control signal DM indicates whether the related bank is in the write mask state. The control signal CLP is the column select signal which activates the column decoders 65. The control signal WERP defines a write timing after the column select signal CLP is output. The control signal SBE is a sense buffer enable signal, which activates the output amplifier 67b shown in FIG. 33. The control signal WEN is a write enable signal, which activates/deactivates the write amplifier 67a shown in FIG. 33. A control signal GRS, which activates the short-circuiting unit 67c, and simultaneously deactivates the write amplifier 67a and the output amplifier 67b.

The control unit 66 is made up of peripheral signal generating circuits 66a, 66e and 66f, a WRT generating circuit 66b, an SBE generating circuit 66c, a WEN generating circuit 66d, and a GRS generating circuit 66g. The circuit 66a derives an internal signal from the control signals WRCT and DM, the above internal signal indicating whether the related bank is in the write mask state at the time of the write state. The WRT generating circuit 66b transfers the control signal WRT to the read/write buffer 67 shown in FIG. 33. The SBE generating circuit 66c generates the signal SBE from the control signals WRT and CLP. The internal signal generating circuit 66e generates an internal signal indicative of data write timing from the control signal WERP and the control signal WSW. The internal signal generating circuit 66f generates, from the control signal CLP and the data write timing signal, an internal signal indicative of a data bus short-circuiting timing when the column select signal CLP is not received. The GRS generating circuit 66g generates, from the control signal SBE and the internal control signal from the circuit 66f, the control signal GRS.

Figure 35:
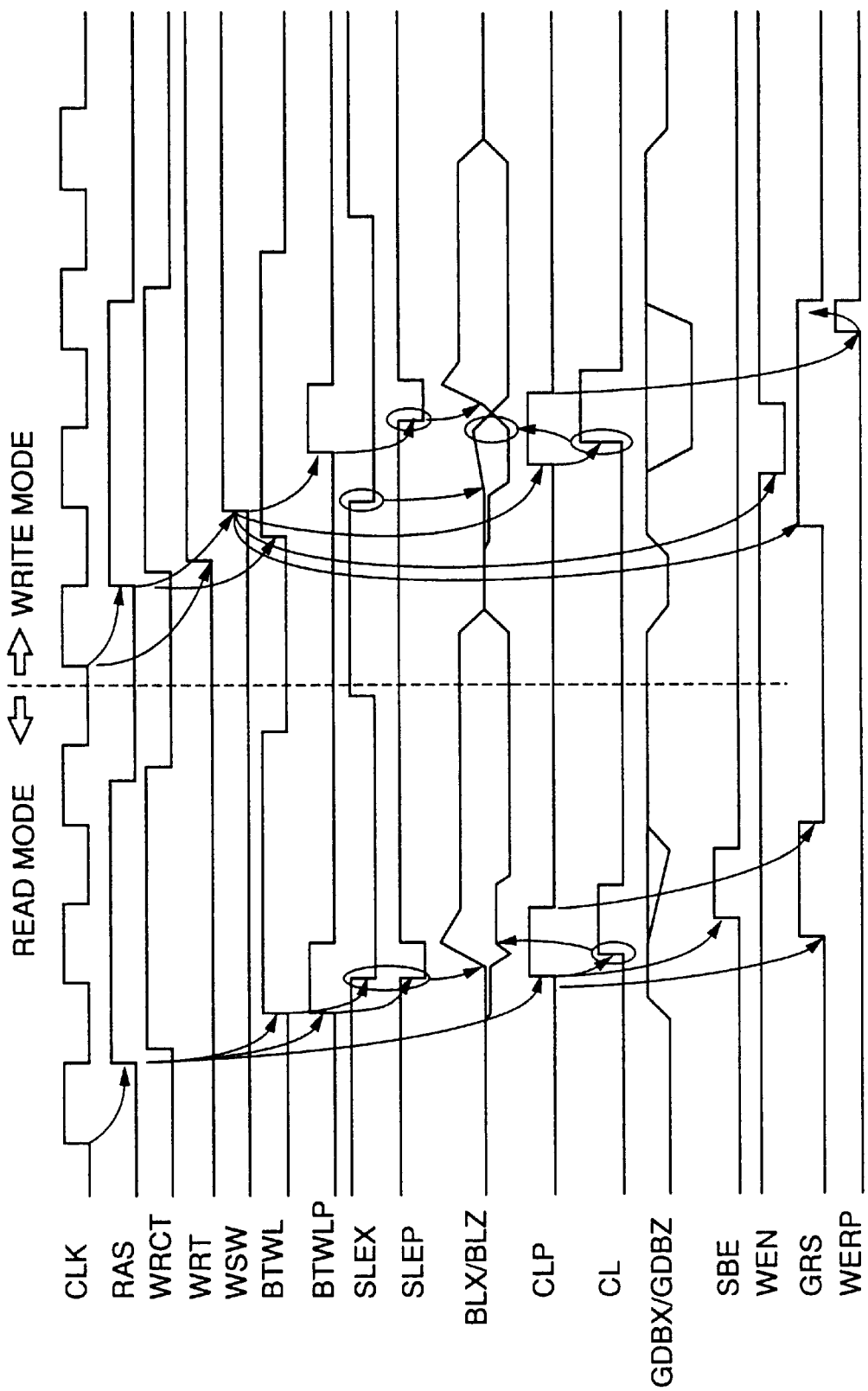
FIG. 35 is a timing chart of an operation of the configurations shown in FIGS. 33 and 34.

FIG. 35 is a timing chart of an operation of the configurations shown in FIGS. 33 and 34. The left-side part of the timing chart shows an operation in the read mode and the right-side part thereof shows an operation in the write mode. Timing signals BTWL, BTWLP, SLEX and SLEP are generated by the control unit 55 from the row address strobe signal RAS applied thereto, and are applied to the sense amplifiers shown in FIG. 33. A symbol BLX/BLZ denote shows potential changes of a pair of core data bus lines 74 shown in FIG. 33. A symbol GDBX and GDBZ denotes potential changes of the peripheral data bus lines 75 shown in FIG. 33.

In the read mode, the control unit 55 receives the row address strobe signal RAS and generates the control signals BTWL, BTWLP, SLE and SLEP, which signals are applied to the sense amplifiers shown in FIG. 33. The column select signal CLP generated by the control unit 55 is applied to the column decoders 65 shown in FIG. 33. Thus, as shown in FIG. 35, the selected sense amplifier starts to sense data on the corresponding core bit lines 74 and amplifies the potential difference between the core data bus lines 74 (BLX, BLZ). A signal CL is a delayed signal of the column select signal CLP generated in the selected column decoder 65, and is actually applied to the selected column line. When the signal CL is activated, the signal CL is switched to a Vii level, which is a step-down potential obtained by stepping down an external power supply voltage Vdd higher than the Vii potential. In response to the rising edge of the column select signal CLP, the control signal GRS rises and then the control signal SBE rises. In response to the control signal GRS, the core data bus lines 74 are short-circuited by the short-circuiting unit 67c. When the control signal SBE rises, the output amplifier 67b is activated and the data read to the core data bus lines 74 are output to the peripheral data bus lines 75, so that the potentials of the peripheral data bus lines GDBX/GDBZ are changed as shown in FIG. 35.

In the write mode, the control signal GRS rises in response to the rising edge of the control signal WSW, and the core data bus lines 74 are short-circuited. Further, the control signal WEN falls, and the write amplifier 67a is activated. In response to the rising edge of the control signal WSW, the column select signals CLP and CL rise successively, and data on the peripheral data bus lines 75 are written into the core data bus lines 74. In this case, the potential of the column select signal CL is set to the external power supply voltage Vdd higher than Vii. In the case shown in FIG. 35, the potentials of the core data bus lines 74 are mutually inverted, and are then amplified in response to the falling edge of the control signal SLEP.

The present invention is not limited to the specifically disclosed embodiments, and variations and modifications may be made without departing from the scope of the present invention.

What is claimed is:

1. A semiconductor integrated circuit memory comprising banks each having at least one memory cell array and connected to a first data bus,
   each of the banks comprising a control part which is supplied with information indicated by a command and thus controls a data write or read operation on a corresponding bank,
   the control part controlling data write and read operations on the corresponding bank so that the corresponding bank is prevented from occupying the first data bus until read data is output to the first data bus by the data read operation.

2. The semiconductor integrated circuit memory as claimed in claim 1, wherein the banks are coupled to the first data bus through respective second data buses separately provided to the banks.

3. The semiconductor integrated circuit memory as claimed in claim 1, wherein the banks are coupled to the first data bus through respective second data buses separately provided to the banks, each of the second data buses being separated into a write data bus and a read data bus.

4. The semiconductor integrated circuit memory as claimed in claim 1, wherein each of the banks has a third data bus connected to a sense amplifier part and separated into a write data bus and a read data bus.

5. The semiconductor integrated circuit memory as claimed in claim 1, wherein the data write operation on one of the banks is performed while the data read operation on another one of the banks is performed.

6. The semiconductor integrated circuit memory as claimed in claim 1, wherein, when the data read operation on one of the banks is in progress, a write command directed to said one of the banks is not accepted.

7. The semiconductor integrated circuit memory as claimed in claim 1, wherein each of the banks comprises a first address latch part which latches a write address associated with a write command directed to a first bank which is one of the banks while the data read operation on said first bank is in progress and an associated read address is latched in a second address latch part.

8. The semiconductor integrated circuit memory as claimed in claim 7, wherein:
   the write address and the write command associated therewith are temporarily stored in the control part;
   when a latency period resulting from the data read operation in progress is longer than a time necessary for the data write operation, the data write operation on the first bank is performed while the data read operation on the first bank is performed; and
   when the latency period resulting from the data read operation in progress is shorter than the time necessary for the data write operation, the data write operation on the first bank is performed after the data read operation on the first bank is performed.

9. A data bus control method for a semiconductor integrated circuit memory comprising banks each having at least one memory cell array and connected to a first data bus, the method comprising the steps of:
   (a) receiving a command; and
   (b) controlling, for each of the banks, data write/read operations based on the command so that the first data bus is prevented from being occupied by a data read operation on one of the banks in progress until read data is output to the first data bus.

10. The data bus control method as claimed in claim 9, wherein the step (b) controls the data write/read operations in each of the banks independently by using respective second data buses separately provided to the banks.

11. The data bus control method as claimed in claim 9, wherein the step (b) controls the data write/read operations in each of the banks independently by using respective second data buses separately provided to the banks, each of the second data buses being separated into a write data bus and a read data bus.

12. The data bus control method as claimed in claim 9, wherein the step (b) controls the data write/read operations in each of the banks independently by using a third data bus provided in each of the banks and connected to a sense amplifier part, the third data bus being separated into a write data bus and a read data bus.

13. The data bus control method as claimed in claim 9, wherein the step (b) controls the data write/read operations so that the data write operation on one of the banks is performed while the data read operation on another one of the banks is performed.

14. The data bus control method as claimed in claim 9, wherein the step (b) controls the data write/read operations so that, when the data read operation on one of the banks is in progress, a write command directed to said one of the banks is not accepted.

15. The data bus control method as claimed in claim 9, wherein the step (b) controls the data write/read operations so that a write address associated with a write command directed to a first bank which is one of the banks is latched in an address latch part while the data read operation on said first bank is in progress and an associated read address is latched in another address latch part.

16. A semiconductor integrated circuit memory comprising banks each having at least one memory cell array and connected to a first data bus,
   each of the banks comprising a control part which is supplied with a write command and a read command and thus controls a data write or read operation on a corresponding bank,
   wherein, when the control part in another one of the banks is performing the data read operation in response to the read command, the control part of the corresponding bank latches the write command and write data associated therewith and starts to perform the data write operation on the corresponding bank.

17. The semiconductor integrated circuit memory as claimed in claim 16, wherein the first data bus is separated into a write data bus and a read data bus.

18. The semiconductor integrated circuit memory as claimed in claim 16, wherein the banks are coupled to the first data bus through respective second data buses separately provided to the banks.

19. The semiconductor integrated circuit memory as claimed in claim 16, wherein the banks are coupled to the first data bus through respective second data buses separately provided to the banks, each of the second data buses being separated into a write data bus and a read data bus.

20. The semiconductor integrated circuit memory as claimed in claim 16, wherein each of the banks has a third data bus connected to a sense amplifier part and separated into a write data bus and a read data bus.

21. The semiconductor integrated circuit memory as claimed in claim 16, wherein, when the data read operation on one of the banks is in progress, a write command directed to said one of the banks is not accepted.

22. The semiconductor integrated circuit memory as claimed in claim 16, wherein each of the banks comprises a first address latch part which latches a write address associated with a write command directed to a first bank which is one of the banks while the data read operation on said first bank is in progress and an associated read address is latched in a second address latch part.

23. A data bus control method for a semiconductor integrated circuit memory comprising banks each having at least one memory cell array and connected to a first data bus, the method comprising the steps of:

(a) receiving a command; and (b) controlling, for each of the banks, data write/read operations based on the command so that, when the data read operation is being performed in one of the banks in response to a read command, a write command directed to another one of the banks and write data associated therewith are latched and the data write operation on said another one of the banks is started.

24. The bus control method as claimed in claim 23, wherein the step (b) performs the data write/read operations in each of the banks independently by using the first data bus separated into a write data bus and a read data bus.

25. The bus control method as claimed in claim 23, wherein the step (b) performs the data write/read operations in each of the banks independently by using respective second data buses separately provided to the banks.

26. The bus control method as claimed in claim 23, wherein the step (b) performs the data write/read operations in each of the banks independently by using respective second data buses separately provided to the banks, each of the second data buses being separated into a write data bus and a read data bus.

27. The bus control method as claimed in claim 23, wherein the step (b) performs the data write/read operations in each of the banks independently by using a third data bus connected to a sense amplifier part and separated into a write data bus and a read data bus.

28. The bus control method as claimed in claim 23, wherein the step (b) performs the data write/read operations so that when the data read operation on one of the banks is in progress, a write command directed to said one of the banks is not accepted.

29. The bus control method as claimed in claim 23, wherein the step (b) controls the data write/read operations so that a write address associated with a write command directed to a first bank which is one of the banks is latched in an address latch part while the data read operation on said first bank is in progress and an associated read address is latched in another address latch part.

* * * * *